(12) United States Patent
Yamashita et al.

(10) Patent No.: US 10,986,304 B2
(45) Date of Patent: Apr. 20, 2021

(54) DISPLAY DEVICE

(75) Inventors: Junichi Yamashita, Tokyo (JP);
Katsuhide Uchino, Kanagawa (JP)

(73) Assignee: JOLED Inc., Tokyo (JP)

( * ) Notice: Subject to any disclaimer, the term of this patent is extended or adjusted under 35 U.S.C. 154(b) by 960 days.

(21) Appl. No.: 12/588,758

(22) Filed: Oct. 27, 2009

(65) Prior Publication Data

US 2010/0123837 A1 May 20, 2010

(30) Foreign Application Priority Data

Nov. 17, 2008 (JP) .............................. JP2008-293286

(51) Int. Cl.
*G09G 3/3233* (2016.01)
*H04N 5/70* (2006.01)
*H01L 27/32* (2006.01)

(52) U.S. Cl.
CPC ............. *H04N 5/70* (2013.01); *G09G 3/3233* (2013.01); *G09G 2300/0819* (2013.01); *G09G 2300/0842* (2013.01); *G09G 2300/0861* (2013.01); *G09G 2320/0252* (2013.01); *G09G 2320/043* (2013.01); *G09G 2320/045* (2013.01); *G09G 2360/145* (2013.01); *G09G 2360/147* (2013.01); *H01L 27/3244* (2013.01)

(58) Field of Classification Search
CPC ......... G09G 3/3233; G09G 2320/0252; G09G 2300/0842; G09G 2360/145; G09G 2360/147; G09G 2300/0819; G09G 2320/045; G09G 2300/0861; G09G 2320/043; H04N 5/70; H01L 27/3244

USPC .......................................... 345/207, 690, 694
See application file for complete search history.

(56) References Cited

U.S. PATENT DOCUMENTS

| | | | |
|---|---|---|---|
| 6,229,508 B1* | 5/2001 | Kane ................................. | 345/82 |
| 7,057,588 B2* | 6/2006 | Asano et al. .................... | 345/76 |
| 7,102,202 B2* | 9/2006 | Kobayashi et al. ........... | 257/401 |
| 7,109,952 B2* | 9/2006 | Kwon .............................. | 345/76 |
| 7,773,057 B2* | 8/2010 | Choi et al. ...................... | 345/77 |
| 7,876,294 B2* | 1/2011 | Sasaki et al. ................... | 345/77 |
| 2003/0057895 A1* | 3/2003 | Kimura .......................... | 315/370 |
| 2003/0227262 A1 | 12/2003 | Kwon | |

(Continued)

FOREIGN PATENT DOCUMENTS

| | | |
|---|---|---|
| JP | 2003-255856 | 9/2003 |
| JP | 2003-271095 | 9/2003 |

(Continued)

*Primary Examiner* — Jeff Piziali
(74) *Attorney, Agent, or Firm* — Michael Best & Friedrich LLP

(57) ABSTRACT

A display device includes: a panel in which plural pixels that emit lights according to a video signal are sectioned into plural areas; a light reception sensor that is arranged in each of the areas and outputs a light reception signal according to light emission luminance; and signal processing means. The area includes first and second pixel groups including at least one pixel and plural pixels other than the first pixel group, respectively. The signal processing means includes arithmetic means for outputting an arithmetic signal according to arithmetic operation of an offset value and a light reception value; converting means for outputting digital data according to the arithmetic signal; and correcting means for correcting the video signal according to the digital data and supplying the corrected video signal to the first pixel group.

8 Claims, 30 Drawing Sheets

(56) References Cited

U.S. PATENT DOCUMENTS

| | | | |
|---|---|---|---|
| 2004/0046164 A1 | 3/2004 | Kobayashi et al. | |
| 2004/0070557 A1 | 4/2004 | Asano et al. | |
| 2005/0110786 A1* | 5/2005 | Inoue et al. | 345/210 |
| 2005/0128193 A1* | 6/2005 | Lueder | 345/207 |
| 2005/0206590 A1 | 9/2005 | Sasaki et al. | |
| 2006/0061293 A1* | 3/2006 | Kobayashi et al. | 315/169.3 |
| 2008/0062091 A1* | 3/2008 | Stewart | 345/76 |
| 2009/0066682 A1* | 3/2009 | Kobayashi et al. | 345/211 |
| 2009/0231313 A1* | 9/2009 | Teranishi et al. | 345/207 |

FOREIGN PATENT DOCUMENTS

| | | |
|---|---|---|
| JP | 2004-029791 | 1/2004 |
| JP | 2004-093682 | 3/2004 |
| JP | 2004-133240 | 4/2004 |
| WO | WO 2007132835 A1 * | 11/2007 |

* cited by examiner

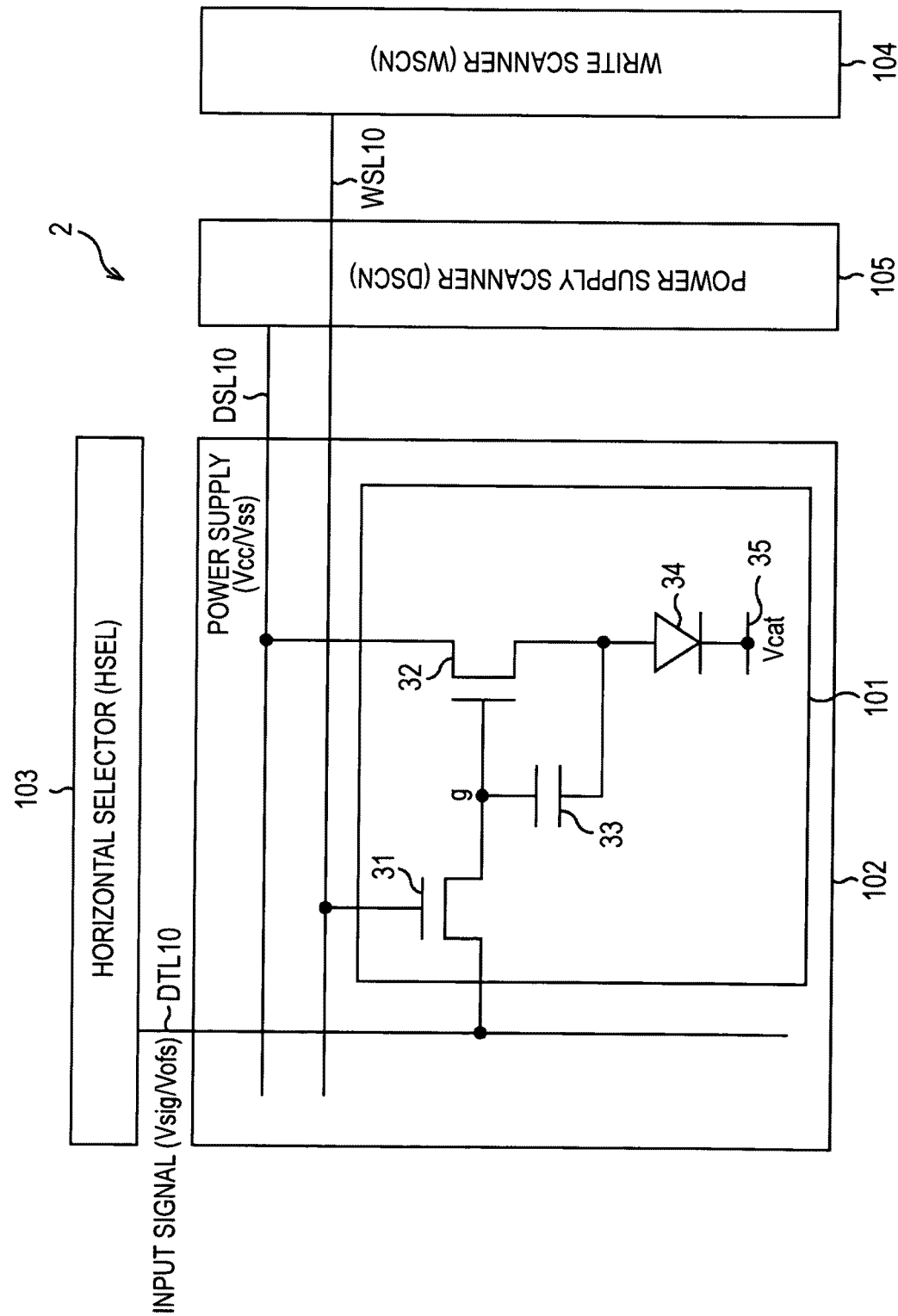

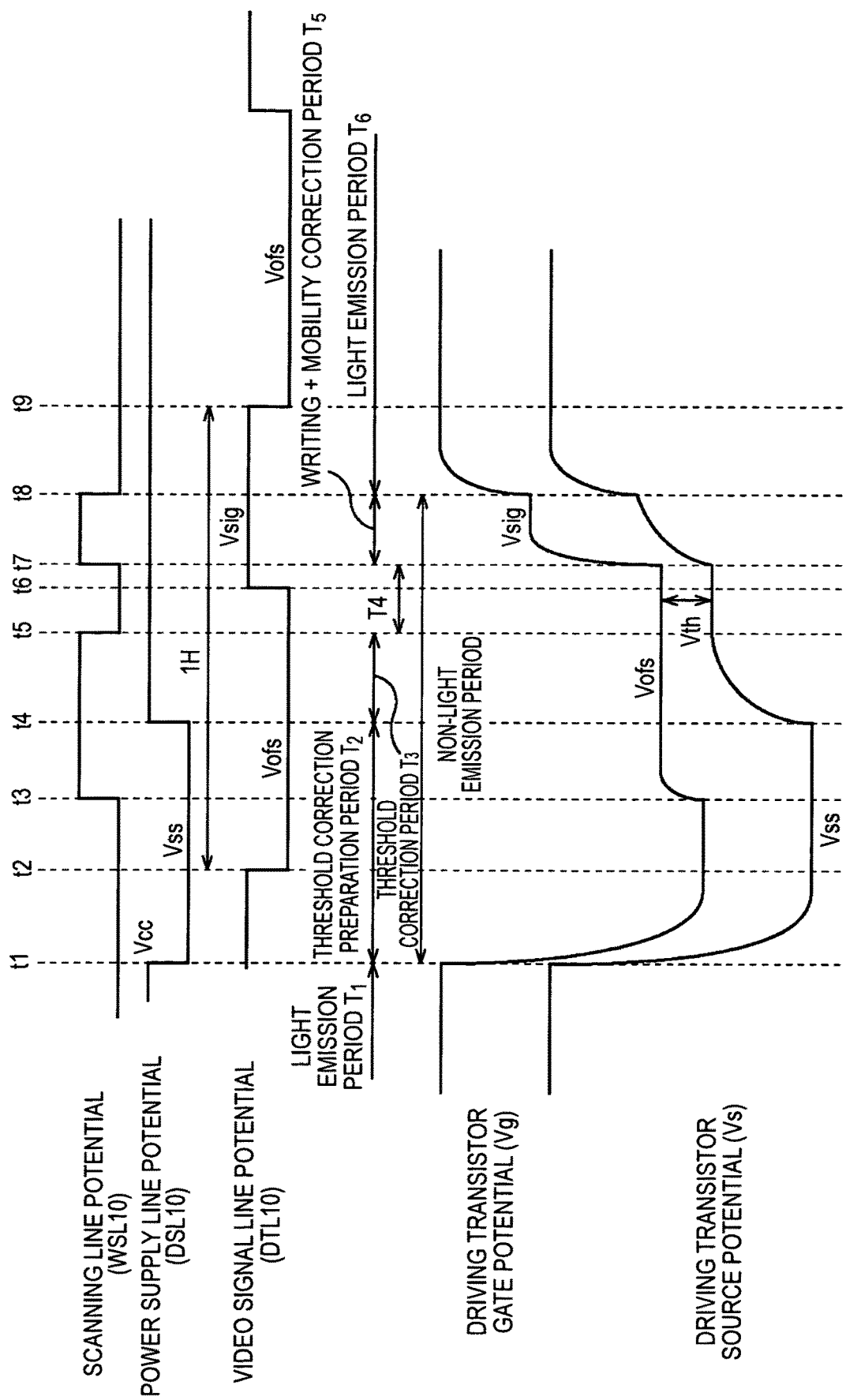

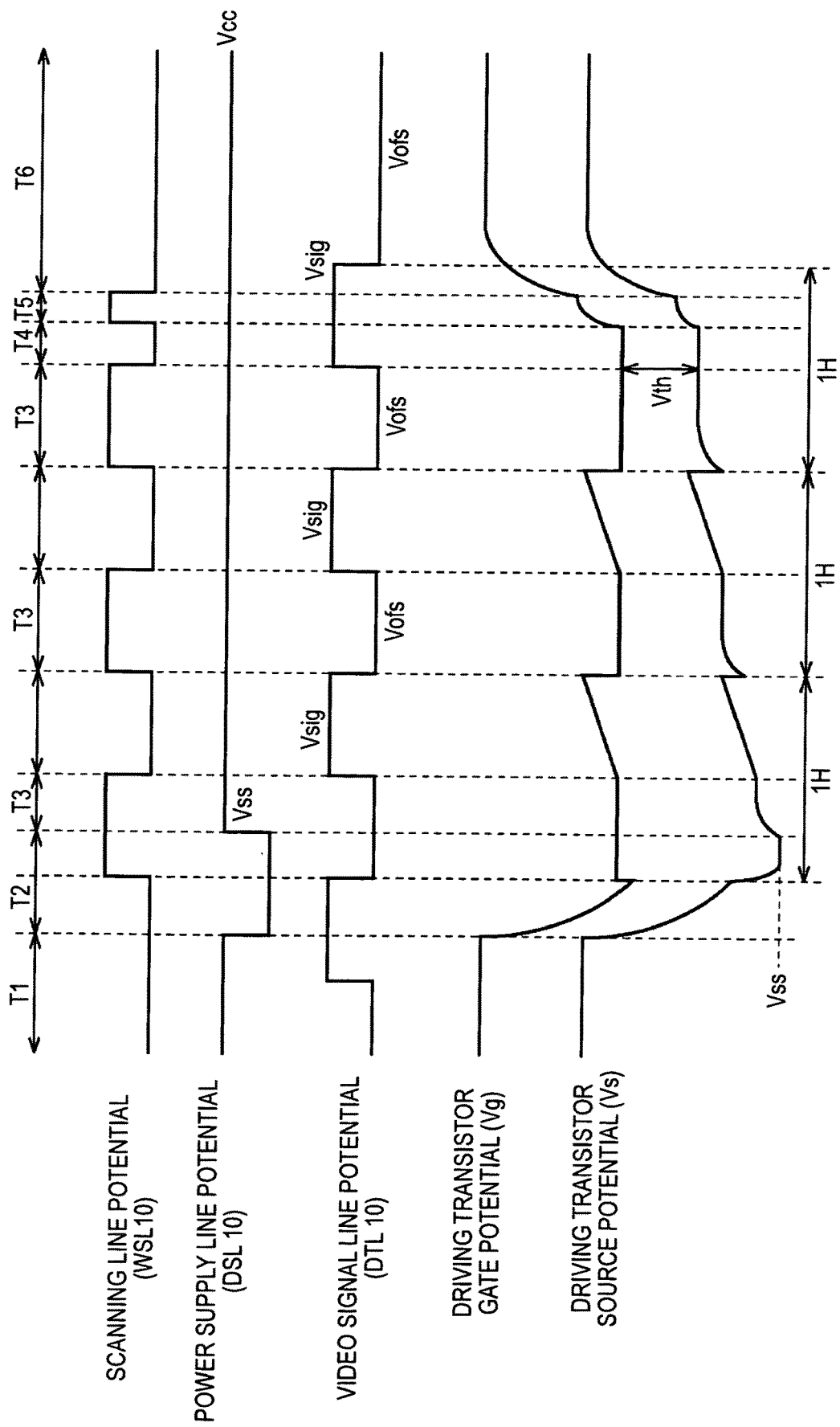

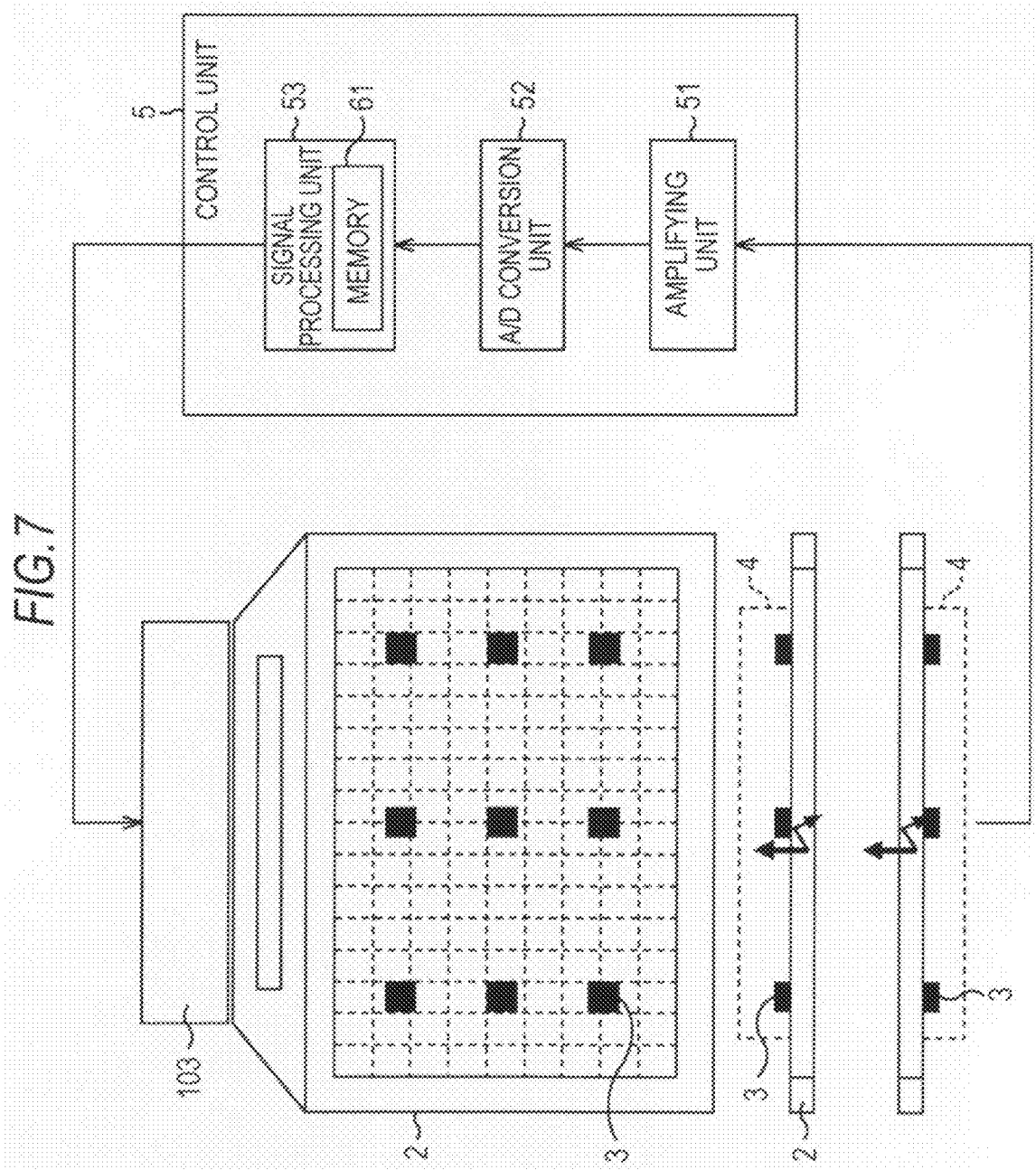

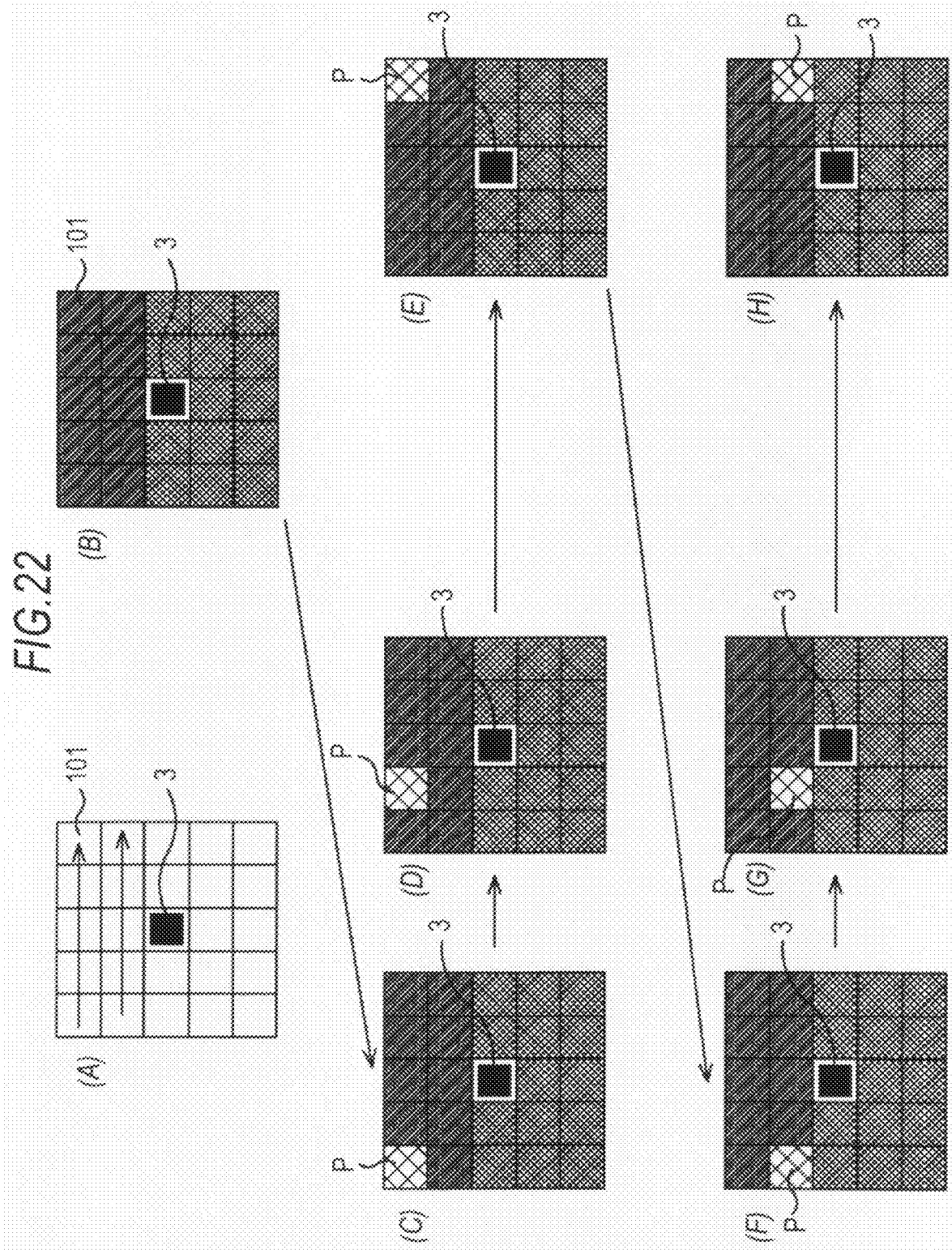

DISPLAY DEVICE

BACKGROUND OF THE INVENTION

1. Field of the Invention

The present invention relates to a display device and a display control method, and, more particularly to a display device that makes it possible to perform burning correction at high speed.

2. Description of the Related Art

In recent years, the development of plane self-emitting panels (EL panels) including an organic EL (Electro Luminescent) device as a light emitting element is actively performed. The organic EL device is a device that has a diode characteristic and makes use of a phenomenon in which an organic thin film emits light when an electric field is applied thereto. The organic EL device is a self-emitting element that consumes low power because the organic EL device is driven at applied voltage equal to or lower than 10 V. The self-emitting element emits light by itself. Therefore, the organic EL device has a characteristic that an illumination member is unnecessary and reductions in weight and thickness are easy. Response speed of the organic EL device is extremely high at about several microseconds. Therefore, the EL panels have a characteristic that an after-image during moving image display does not occur.

Among the plane self-emitting panels including the organic EL device used for pixels, in particular, an active-matrix panel including thin film transistors, which are integrated and formed in pixels as driving elements, is actively developed. The active-matrix plane self-emitting panel is disclosed in, for example, JP-A-2003-255856, JP-A-2003-271095, JP-A-2004-133240, JP-A-2004-029791, and JP-A-2004-093682.

SUMMARY OF THE INVENTION

The organic EL device also has a characteristic that luminance efficiency falls in proportion to a light emission amount and light emission time. The light emission luminance of the organic EL device is represented by a product of a current value and the luminance efficiency. Therefore, the fall in the luminance efficiency leads to the fall in the light emission luminance. As display on a screen, an image is rarely displayed uniformly in respective pixels. In general, the light emission amount is different for each of the pixels. Therefore, even under the same driving condition, a degree of the fall in the light emission luminance is different in the respective pixels according to differences in light emission amounts and light emission times in the past. As a result, a user visually recognizes a phenomenon in which burning seemingly occurs in a pixel having an extremely high degree of the fall in the luminance efficiency compared with other pixels (hereinafter referred to as burning phenomenon).

Therefore, among display devices mounted with the organic EL device in the past, some display device applies correction for uniformalizing luminance efficiencies (hereinafter referred to as burning correction) to pixels having different degrees of the fall in the luminance efficiency. However, when such burning correction is performed, in some case, processing time of an entire correction system is long.

Therefore, it is desirable to make it possible to perform the burning correction at high speed.

According to an embodiment of the present invention, there is provided a display device including: a panel in which plural pixels that emit lights according to a video signal are sectioned into plural areas; a light reception sensor that is arranged in each of the areas and outputs a light reception signal according to light emission luminance; and signal processing means for applying processing to the light reception signal. The area includes: a first pixel group including at least one pixel; and a second pixel group including plural pixels other than the first pixel group. The signal processing means sets, as an offset value, a light reception signal obtained when the first pixel group and the second pixel group are caused to emit lights at predetermined light emission luminance and sets, as a light reception value, a light reception signal obtained when the second pixel group is caused to emit light at the predetermined light emission luminance and light emission luminance of the first pixel group is changed, and includes: arithmetic means for outputting an arithmetic signal according to arithmetic operation of the offset value and the light reception value; converting means for outputting digital data according to the arithmetic signal; and correcting means for correcting the video signal according to the digital data and supplying the corrected video signal to the first pixel group.

According to the embodiment, the display device includes the panel in which plural pixels that emit lights according to a video signal are sectioned into plural areas and the light reception sensor that is arranged in each of the areas and outputs a light reception signal according to light emission luminance. Digital data is output according to the light reception signal. Processing is applied to the light reception signal according to the digital data. The area includes the first pixel group including at least one pixel and the second pixel group including plural pixels other than the first pixel group. Digital data obtained when the first pixel group and the second pixel group are caused to emit lights at predetermined light emission luminance is set as offset data. Digital data obtained when light emission luminance of the second pixel group is maintained and light emission luminance of the first pixel group is changed is obtained as digital data. The video signal is corrected according to arithmetic operation of the offset data and the light reception data. The corrected video signal is supplied to the first pixel group.

According to another embodiment of the present invention, there is provided a display device including: a panel in which plural pixels that emit lights according to signal potential corresponding to a video signal are sectioned into plural areas; a light reception sensor that is arranged in each of the areas and outputs a light reception signal according to light emission luminance; converting means for outputting digital data according to the light reception signal; and signal processing means for applying processing to the light reception signal according to the digital data. The area includes: a first pixel group including at least one pixel; and a second pixel group including plural pixels other than the first pixel group. The signal processing means sets, as offset data, digital data obtained when first signal potential is supplied to the first pixel group and the second pixel group, sets, as light reception data, digital data obtained when the first signal potential is supplied to the second pixel group and second signal potential is supplied to the first pixel group, corrects the video signal according to a difference between the offset data and the light reception data, and supplies the corrected video signal to the first pixel group.

According to the embodiment, the display device includes the panel in which plural pixels that emit lights according to signal potential corresponding to a video signal are sectioned into plural areas and the light reception sensor that is arranged in each of the areas and outputs a light reception signal according to light emission luminance. Digital data is output according to the light reception signal. Processing is applied to the light reception signal according to the digital data. The area includes the first pixel group including at least one pixel and the second pixel group including plural pixels other than the first pixel group. Digital data obtained when first signal potential is supplied to the first pixel group and the second pixel group is set as offset data. Digital data obtained when the first signal potential is supplied to the second pixel group and second signal potential is supplied to the first pixel group is set as light reception data. The video signal is corrected according to a difference between the offset data and the light reception data. The corrected video signal is supplied to the first pixel group.

According to the embodiments of the present invention, it is possible to perform burning correction at high speed.

BRIEF DESCRIPTION OF THE DRAWINGS

FIG. 4 is a block diagram of a detailed circuit configuration of the pixel included in the EL panel shown in FIG. 2;

FIG. 5 is a timing chart for explaining an example of operation of the pixel included in the EL panel shown in FIG. 2;

FIG. 6 is a timing chart for explaining another example of the operation of the pixel included in the EL panel shown in FIG. 2;

FIG. 7 is a diagram of a functional configuration example of the display device shown in FIG. 1 and is a functional block diagram of the display device necessary for executing burning correction control;

FIG. 22 is a diagram for explaining a fourth example of the burning correction control method according to the embodiment;

DESCRIPTION OF THE PREFERRED EMBODIMENTS

Embodiment of the Present Invention

[Configuration of a Display Device]

Figure 1:
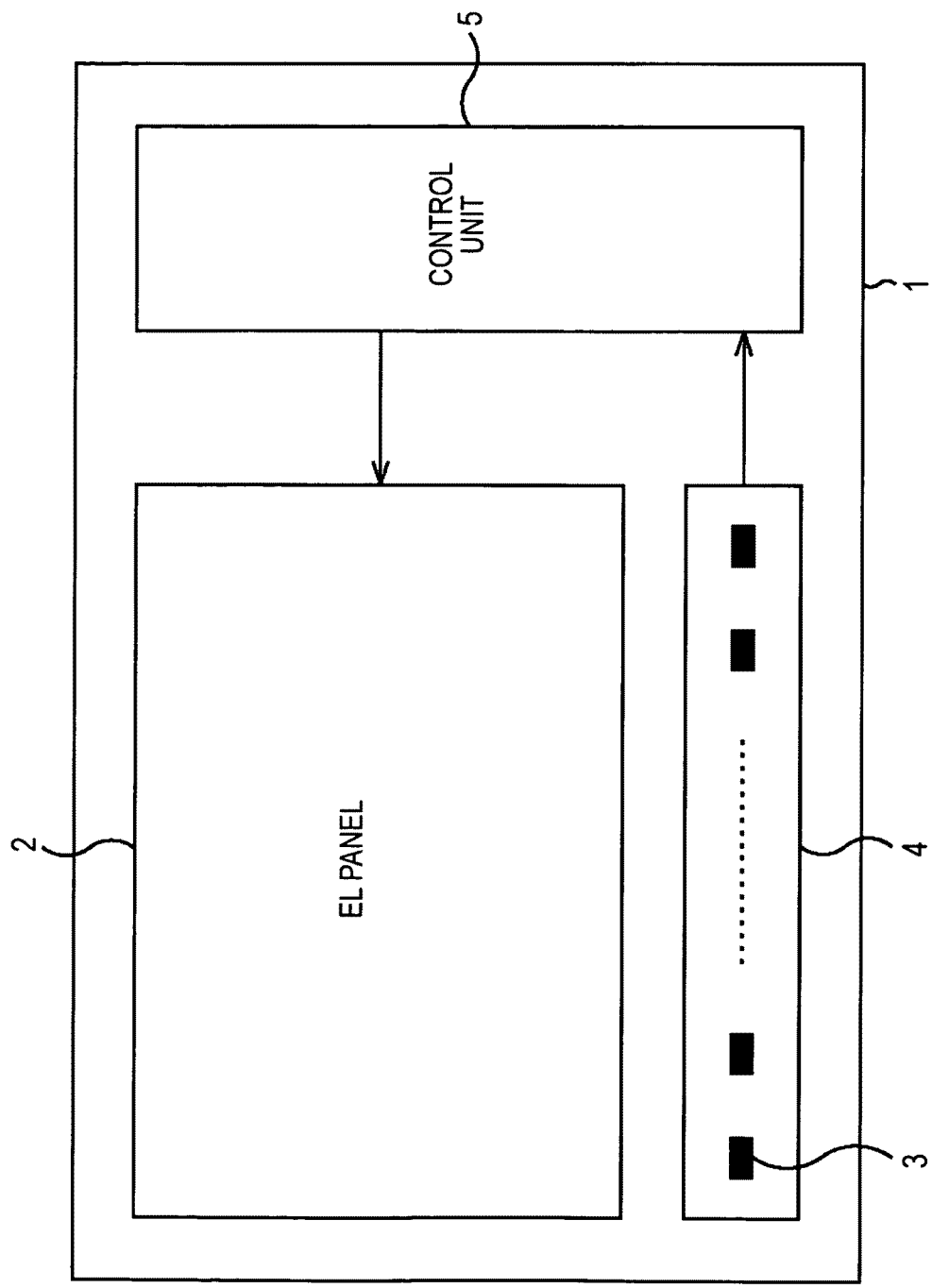
FIG. 1 is a block diagram of a configuration example of a display device according to an embodiment of the present invention.

FIG. 1 is a block diagram of a configuration example of a display device according to an embodiment of the present invention.

A display device 1 shown in FIG. 1 includes an EL panel 2, a sensor group 4 including plural light reception sensors 3, and a control unit 5. The EL panel 2 is configured as a panel including an organic EL device as a self-emitting element. The light reception sensors 3 are configured as sensors that measure the light emission luminance of the EL panel 2. The control unit 5 controls the display of the EL panel 2 on the basis of the light emission luminance of the EL panel 2 obtained from the plural light reception sensors 3.

[Configuration of an EL Panel]

Figure 2:
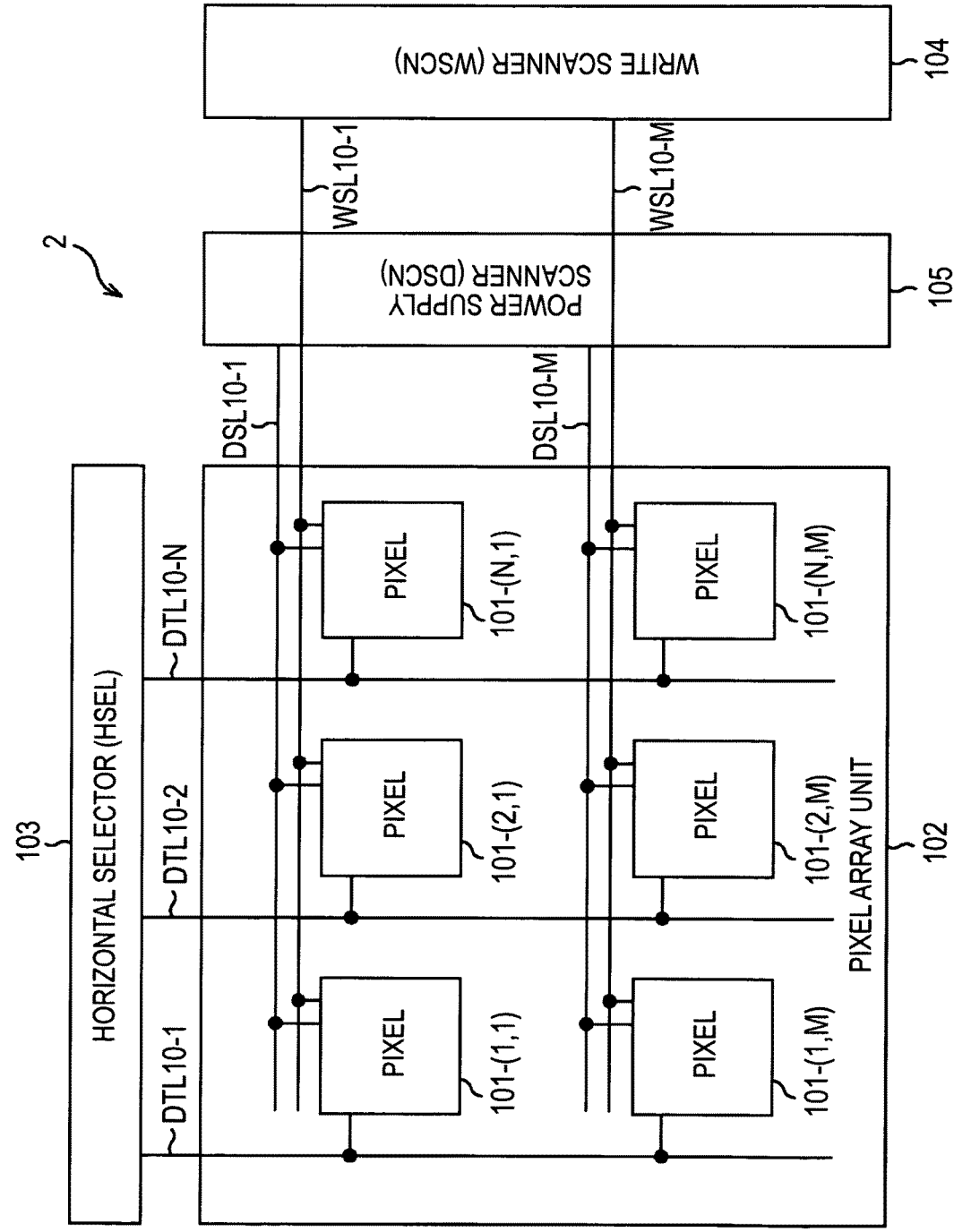
FIG. 2 is a block diagram of a configuration example of an EL panel of the display device shown in FIG. 1.

FIG. 2 is a block diagram of a configuration example of the EL panel 2.

The EL panel 2 includes a pixel array unit 102, a horizontal selector (HSEL) 103, a write scanner (WSCN) 104, and a power supply scanner (DSCN) 105. In the pixel array unit 102, N×M (N and M are one or more integer values independent from each other) pixels (pixel circuits) 101-(1, 1) to 101-(N,M) are arranged in a matrix shape. The horizontal selector (HSEL) 103, the write scanner (WSCN) 104, and the power supply scanner (DSCN) 105 operate as driving units that drive the pixel array unit 102.

The EL panel 2 also includes M scanning lines WSL10-1 to WSL10-M, M power supply lines DSL10-1 to DSL10-M, and N video signal lines DTL10-1 to DTL10-N.

In the following explanation, when it is unnecessary to specifically distinguish the scanning lines WSL10-1 to WSL10-M, the scanning lines WSL10-1 to WSL10-M are simply referred to as scanning lines WSL10. When it is unnecessary to specifically distinguish the video signal lines DTL10-1 to DTL10-N, the video signal lines DTL10-1 to DTL10-N are simply referred to as video signal lines DTL10. Similarly, the pixels 101-(1,1) to 101-(N,M) and the power supply lines DSL10-1 to DSL10-M are referred to as pixels 101 and power supply lines DSL10, respectively.

The pixels 101-(1,1) to 101-(N,1) in a first row among the pixels 101-(1,1) to 101-(N,M) are connected to the write scanner 104 by the scanning line WSL10-1 and connected to the power supply scanner 105 by the power supply line DSL10-1. The pixels 101-(1,M) to 101-(N,M) in an Mth row among the pixels 101-(1,1) to 101-(N,M) are connected to the write scanner 104 by the scanning line WSL10-M and connected to the power supply scanner 105 by the power supply line DSL10-M. The other pixels 101 arranged in a row direction among the pixels 101-(1,1) to 101-(N,M) are connected in the same manner.

The pixels 101-(1,1) to 101-(1,M) in a first column among the pixels 101-(1,1) to 101-(N,M) are connected to the horizontal selector 103 by the video signal line DTL10-1. The pixels 101-(N, 1) to 101-(N,M) in an Nth column among the pixels 101-(1,1) to 101-(N,M) are connected to the horizontal selector 103 by the video signal line DTL10-N. The other pixels 101 arranged in a column direction among the pixels 101-(1,1) to 101-(N,M) are connected in the same manner.

The write scanner 104 sequentially supplies control signals to the scanning lines WSL10-1 to WSL10-M at a horizontal period (1H) and line-sequentially scans the pixels 101 in row units. The power supply scanner 105 supplies power supply voltage having first potential (Vcc explained later) or second potential (Vss explained later) to the power supply lines DSL10-1 to DSL10-M according to the line-sequential scanning. The horizontal selector 103 switches signal potential Vsig corresponding to a video signal and a reference potential Vofs within each horizontal period (1H) according to the line-sequential scanning and supplies the signal potential Vsig and the reference potential Vofs to the video signal lines DTL10-1 to DTL10-M arranged in a column shape.

[Array Configuration of the Pixels 101]

Figure 3:
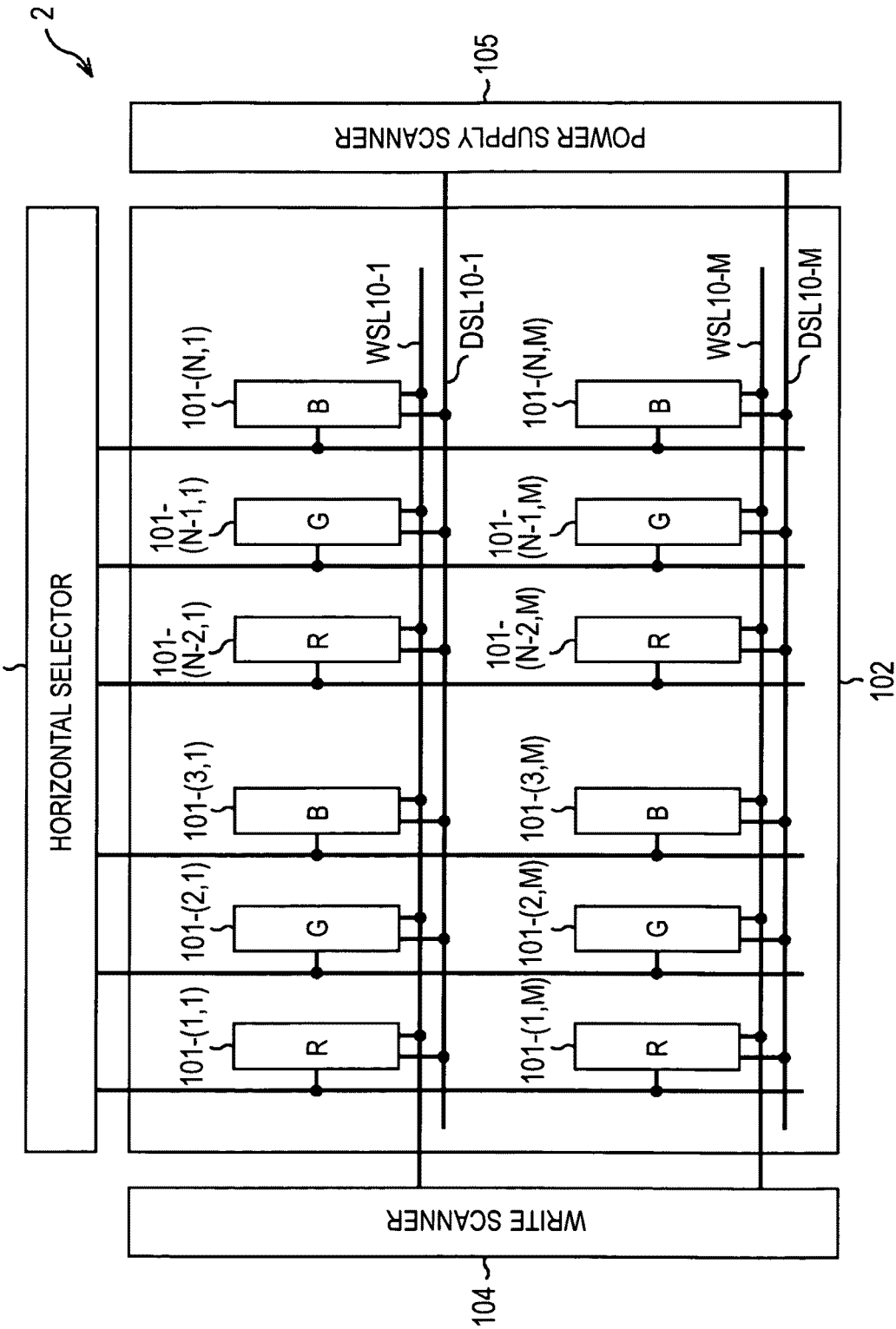
FIG. 3 is a diagram of an array of colors of lights emitted by pixels included in the EL panel shown in FIG. 2.

FIG. 3 is a diagram of array of colors of lights emitted by the pixels 101 of the EL panel 2.

The pixels 101 of the pixel array unit 102 are equivalent to so-called sub-pixels that emit lights of any one of red (R), green (G), and blue (B). One pixel as a display unit includes three pixels 101 for red, green, and blue arranged in the row direction (a left to right direction in the figure).

FIG. 3 is different from FIG. 2 in that the write scanner 104 is arranged on the left side of the pixel array unit 102. The scanning lines WSL10 and the power supply lines DSL10 are connected from the under side of the pixels 101. Wires connected to the horizontal selector 103, the write scanner 104, and the power supply scanner 105, and the pixels 101 can be arranged in appropriate positions according to necessity.

[Detailed Circuit Configuration of the Pixel 101]

FIG. 4 is an enlarged block diagram of a detailed circuit configuration of the pixel 101 among the N×M pixels 101 included in the EL panel 2.

The scanning line WSL10, the video signal line DTL10, and the power supply line DSL10 connected to the pixel 101 in FIG. 4 respectively correspond to scanning lines WSL10-(n,m), the video signal lines DTL10-(n,m), and the power supply lines DSL10-(n,m) for the pixels 101-(n,m) (n=1, 2, . . . , and N and m=1, 2, . . . , and M) in FIG. 2.

The pixel 101 shown in FIG. 4 includes a sampling transistor 31, a driving transistor 32, a storage capacitor 33, and a light emitting element 34. A gate of the sampling transistor 31 is connected to the scanning line WSL10. A drain of the sampling transistor 31 is connected to the video signal line DTL10 and a source thereof is connected to a gate g of the driving transistor 32.

One of a source and a drain of the driving transistor 32 is connected to an anode of the light emitting element 34 and the other is connected to the power supply line DSL10. The storage capacitor 33 is connected to the gate g of the driving transistor 32 and the anode of the light emitting element 34. A cathode of the light emitting element 34 is connected to a wire 35 set to predetermined potential Vcat of the light emitting element 34. The potential Vcat is a GND level. Therefore, the wire 35 is a grounding wire.

Both the sampling transistor 31 and the driving transistor 32 are N-channel transistors. Therefore, the sampling transistor 31 and the driving transistor 32 can be formed of amorphous silicon lower in cost than low-temperature polysilicon. This makes it possible to further reduce manufacturing cost for a pixel circuit. It goes without saying that the sampling transistor 31 and the driving transistor 32 may be formed of low-temperature polysilicon or single-crystal silicon.

The light emitting element 34 includes an organic EL element. The organic EL element is a current light emitting element having a diode characteristic. Therefore, the light emitting element 34 performs light emission at a gradation corresponding to a current value Ids of an electric current supplied thereto.

In the pixel 101 configured as explained above, the sampling transistor 31 is turned on (becomes conductive) according to a control signal from the scanning line WSL10 and samples a video signals having the signal potential Vsig corresponding to a gradation via the video signal line DTL10. The storage capacitor 33 accumulates and stores charges supplied from the horizontal selector 103 via the video signal line DTL10. The driving transistor 32 receives the supply of an electric current from the power supply line DSL10 set at the first potential Vcc and feeds (supplies) a driving current Ids to the light emitting element 34 according to the signal potential Vsig stored in the storage capacitor 33. When the predetermined driving current Ids flows to the light emitting element 34, the pixel 101 emits light.

The pixel 101 has a threshold correcting function. The threshold correcting function is a function of causing the storage capacitor 33 to store voltage equivalent to threshold voltage Vth of the driving transistor 32. By causing the pixel 101 to show the threshold correcting function, the influence of the threshold voltage Vth of the driving transistor 32 that causes fluctuation in each of pixels of the EL panel 2 can be cancelled.

The pixel 101 also has a mobility correcting function in addition to the threshold correcting function. The mobility correcting function is a function of applying correction for mobility μ of the driving transistor 32 to the signal potential Vsig when the signal potential Vsig is stored in the storage capacitor 33.

Further, the pixel 101 has a boot strap function. The boot strap function is a function of associating gate potential Vg with the fluctuation in source potential Vs of the driving transistor 32. By causing the pixel 101 to show the boot strap function, voltage Vgs between the gate and the source of the driving transistor 32 can be maintained constant.

[Explanation of the Operation of the Pixel 101]

FIG. 5 is a timing chart for explaining the operation of the pixel 101.

In FIG. 5, potential changes in the scanning line WSL10, the power supply line DSL10, and the video signal line DTL10 with respect to the same time axis (a lateral direction in the figure) and changes in the gate potential Vg and the source potential Vs of the driving transistor 32 corresponding to the potential changes are shown.

In FIG. 5, a period until time $t_1$ is a light emission period $T_1$ in which light emission in the preceding horizontal period (1H) is performed.

A period from time $t_1$ when the light emission period $T_1$ ends to time $t_4$ is a threshold correction preparation period $T_2$ in which preparation for threshold voltage correcting operation is performed by initializing the gate potential Vg and the source potential Vs of the driving transistor 32.

In the threshold correction preparation period $T_2$, at time $t_1$, the power supply scanner 105 switches the potential of the power supply line DSL10 from the first potential Vcc as high potential to the second potential Vss as low potential. At time $t_2$, the horizontal selector 103 switches the potential of the video signal line DTL10 from the signal potential Vsig to the reference potential Vofs. At time $t_3$, the write scanner 104 switches the potential of the scanning line WSL10 to the high potential to turn on the sampling transistor 31. Consequently, the gate potential Vg of the driving transistor 32 is reset to the reference potential Vofs and the source potential Vs is reset to the second potential Vss of the video signal line DTL10.

A period from time $t_4$ to time $t_5$ is a threshold correction period $T_3$ in which threshold correcting operation is performed. In the threshold correction period $T_3$, at time $t_4$, the power supply scanner 105 switches the potential of the power supply line DSL10 to the high potential Vcc. Voltage equivalent to the threshold voltage Vth is written in the storage capacitor 33 connected between the gate and the source of the driving transistor 32.

In a writing and mobility correction preparation period $T_4$ from time $t_5$ to time $t_7$, the potential of the scanning line WSL10 is once switched from the high potential to the low potential. At time $t_6$ before time $t_7$, the horizontal selector 103 switches the potential of the video signal line DTL10 from the reference potential Vofs to the signal potential Vsig corresponding to a gradation.

In a writing and mobility correction period $T_5$ from time $t_7$ to time $t_8$, writing of a video signal and mobility correcting operation are performed. In a period from time $t_7$ to time $t_8$, the potential of the scanning line WSL10 is set to the high potential. Consequently, the signal potential Vsig corresponding to the video signal is written in the storage capacitor 33 while being added to the threshold voltage Vth. Voltage for mobility correction $\Delta V_\mu$ is subtracted from the voltage stored in the storage capacitor 33.

At time $t_8$ after the end of the writing and mobility correction period $T_5$, the potential of the scanning line WSL10 is set to the low potential. Thereafter, in a light emission period $T_6$, the light emitting element 34 emits light at light emission luminance corresponding to the signal voltage Vsig. The signal voltage Vsig is adjusted according to voltage equivalent to the threshold voltage Vth and the voltage for mobility correction $\Delta V_\mu$. Therefore, the light emission luminance of the light emitting element 34 is not affected by the fluctuation in the threshold voltage Vth and the mobility μ of the driving transistor 32.

Boot strap operation is performed in the beginning of the light emission period $T_6$. While gate-to-source voltage Vgs=Vsig+Vth−$\Delta V_\mu$ of the driving transistor 32 is maintained constant, the gate potential Vg and the source potential Vs of the driving transistor 32 rise.

At time $t_9$ when predetermined time elapses after time $t_8$, the potential of the video signal line DTL10 is dropped from the signal potential Vsig to the reference potential Vofs. In FIG. 5, a period from time $t_2$ to time $t_9$ is equivalent to the horizontal period (1H).

As explained above, in the pixels 101 of the EL panel 2, it is possible to cause the light emitting elements 34 to emit lights without being affected by the fluctuation in the threshold voltage Vth and the mobility g of the driving transistor 32.

[Explanation of Another Example of the Operation of the Pixel 101]

FIG. 6 is a timing chart for explaining another example of the operation of the pixel 101.

In the example shown in FIG. 5, the threshold correcting operation is performed once in the 1H period. However, in some case, the 1H period is short and it is difficult to perform the threshold correcting operation within the 1H period. In such a case, the threshold correcting operation can be performed plural times over plural 1H periods.

In the example shown in FIG. 6, the threshold correcting operation is performed a continuous 3H period. In other words, in the example shown in FIG. 6, the threshold correction period $T_3$ is divided into three periods. Otherwise, the operation of the pixel 101 is the same as the operation of the example shown in FIG. 5. Therefore, explanation of the operation is omitted.

[Explanation of Burning Correction Control]

An organic EL device has a characteristic that light emission luminance falls in proportion to a light emission amount and light emission time. Therefore, when predetermined time elapses, even under the same driving condition, a degree of the fall in the luminance efficiency of the pixels 101 is different according to a light emission amount and light emission time to that point. Therefore, there is the pixel 101 in which a degree of the fall in the luminance efficiency is extremely high compared with the other pixels 101 because of the fluctuation in the fall of the luminance efficiency of the pixels 101. As a result, a user visually recognizes a phenomenon in which burning seemingly occurs in such a pixel 101 (hereinafter referred to as burning phenomenon). Therefore, the display device 1 applies correction for uniformalizing luminance efficiencies (hereinafter referred to as burning correction) to the pixels 101 having different degrees of the fall in the luminance efficiency.

[Functional Configuration Example of the Display Device 1 Necessary for Executing the Burning Correction Control]

FIG. 7 is a functional block diagram of a functional configuration example of the display device 1 necessary for executing the burning correction control.

The light reception sensors 3 are arranged in positions where the light reception sensors 3 do not prevent light emission of the pixels 101 on a display surface of the EL panel 2 or a surface opposed to the front surface (in the following explanation, the former is referred to as front surface and the latter referred to as rear surface). The EL panels 2 are sectioned into plural areas and one light reception sensor 3 is arranged in each of the areas. A sensor group 4 includes plural light reception sensors 3 equally arranged at a rate of one reception sensor 3 for one area. For example, in an example shown in FIG. 7, the sensor group 4 includes nine light reception sensors 3. It goes without saying that the number of light reception sensors 3 arranged in the EL panel 2 is not limited to the example shown in FIG. 7.

Each of the light reception sensors 3 receives lights from the pixels 101 included in the area in which the light reception sensor 3 measures light emission luminance. The light reception sensor 3 generates an analog light reception signal (a voltage signal) corresponding to a light reception amount of the lights and supplies the analog light reception signal to the control unit 5. When the light reception sensors 3 are arranged on the rear surface of the EL panel 2, the lights emitted from the pixels 101 are reflected on a glass substrate or the like on the front surface of the EL panel 2 and made incident on the light reception sensors 3. In this embodiment, the light reception sensors 3 are arranged on the rear surface of the EL panel 2.

In the example shown in FIG. 7, the control unit 5 includes an amplifying unit 51, an A/D conversion unit 52, and a signal processing unit 53.

The amplifying unit 51 amplifies analog light reception signals supplied from the light reception sensors 3 and supplies the amplified analog light reception signals to the A/D conversion unit 52. The A/D conversion unit 52 converts the amplified analog light reception signals supplied from the amplifying unit 51 into digital data and supplies the digital data to the signal processing unit 53.

In a memory 61 of the signal processing unit 53, concerning the pixels 101 of the pixel array unit 102, initial values of luminance data (luminance data in a shipped state) are stored as initial data. When digital data concerning the pixel 101 that should be paid attention as a target of processing (hereinafter referred to as pixel of attention P) is supplied to the A/D conversion unit 52, the signal processing unit 53 recognizes luminance data of the pixel of attention P after the elapse of a predetermined period (after aged deterioration) on the basis of the digital data. The signal processing unit 53 calculates, concerning the pixel of attention P, a luminance fall amount of the luminance value after the elapse of the predetermined period with respect to the initial data (the initial luminance value). Concerning the pixel of attention P, the signal processing unit 53 calculates, on the basis of the luminance fall amount, correction data for correcting the luminance fall. Such correction data is calculated for each of the pixels 101 and stored in the memory 61 when the pixels 101 of the pixel array unit 102 are sequentially set as the pixel of attention P.

A section that calculates the correction data in the signal processing unit 53 can be configured by, for example, a signal processing IC such as an FPGA (Field Programmable Gate Array) or an ASIC (Application Specific Integrated Circuit).

As explained above, the correction data for the pixels 101 at a point when the predetermined period elapses is stored in the memory 61. The initial data concerning the pixels 101 is also stored in the memory 61. Besides, various kinds of information necessary for realizing various kinds of processing explained later are also stored in the memory 61.

The signal processing unit 53 controls the horizontal selector 103 to supply, for each of the pixels 101, the signal potential Vsig corresponding to the video signal input to the display device 1. In supplying the signal potential Vsig, the signal processing unit 53 reads out the correction data for the pixels 101 from the memory 61 and determines, for each of the pixels 101, the signal potential Vsig with the luminance fall due to aged deterioration corrected.

[Burning Correction Control in the Past]

The problem of the burning correction control in the past explained in the section of Summary of the Invention is explained below.

As explained above, in the burning correction control, the luminance data of the pixel of attention P is used. The luminance data of the pixel of attention P is generated on the basis of the digital data obtained as a result of amplifying the light reception signal of the light reception sensor 3 and applying the A/D conversion to the amplified analog signal.

However, as shown in FIG. 7, one light reception sensor 3 is not used for one pixel 101 but one light reception sensor 3 is used for the area including the plural pixels 101. Therefore, a distance between each of the pixels 101 included in the area and the light reception sensor 3 varies. The output voltage of a light reception signal of the light reception sensor 3 in such a case is as shown in FIGS. 8A and 8B.

Figure 8A:
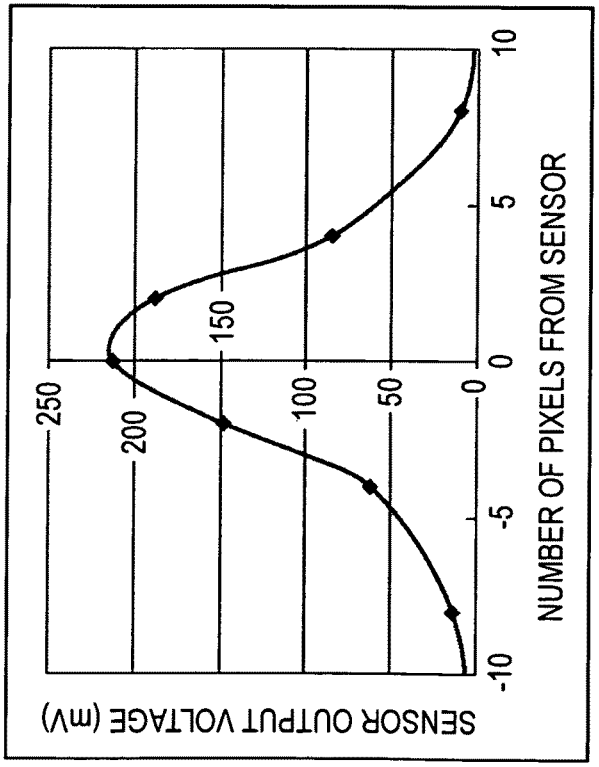
FIGS. 8A and 8B are graphs of an example of a relation between a distance from a light reception sensor 3 and the output voltage of the light reception sensor 3.
Figure 8B:
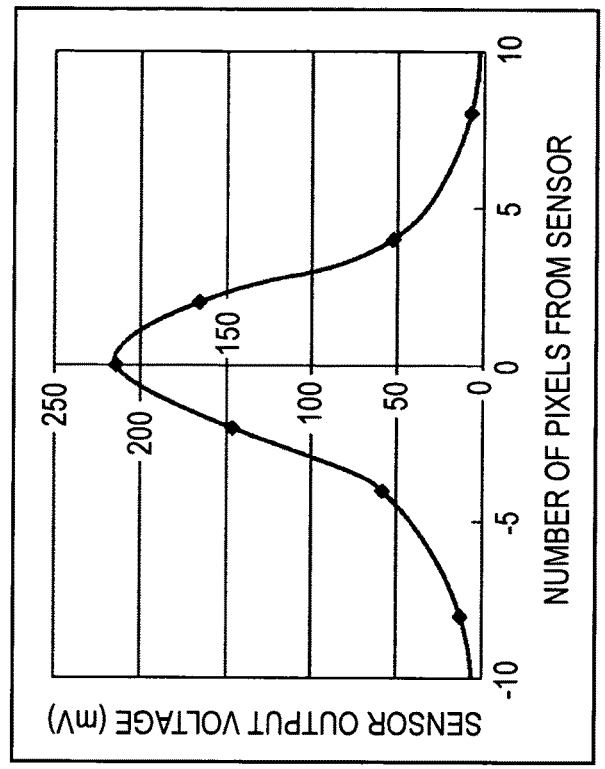

FIGS. 8A and 8B are graphs of an example of a relation between a distance from the light reception sensor 3 and the output voltage of the light reception sensor 3 in the case in which the light reception sensor 3 is arranged in the center of an area including 20×20 pixels 101. As a premise, the light emission luminances of the 20×20 pixels 101 are kept the same. In FIG. 8A, the abscissa indicates a distance in the horizontal direction from the light reception sensor 3 (the unit is the number of pixels) and the ordinate indicates the output voltage (mV) of the light reception sensor 3. In FIG. 8B, the abscissa indicates a distance (the unit is the number of pixels) in the vertical direction from the light reception sensor 3 and the ordinate indicates the output voltage (mV) of the light reception sensor 3.

As shown in FIGS. 8A and 8B, even if the light emission luminances of the pixels 101 included in the area are kept the same, the output voltage of the light reception signal of the light reception sensor 3 decreases as the distance between the pixels 101 and the light reception sensor 3 increases. When such a characteristic is generalized, the light reception sensor 3 has a characteristic shown in FIG. 9.

Figure 9:
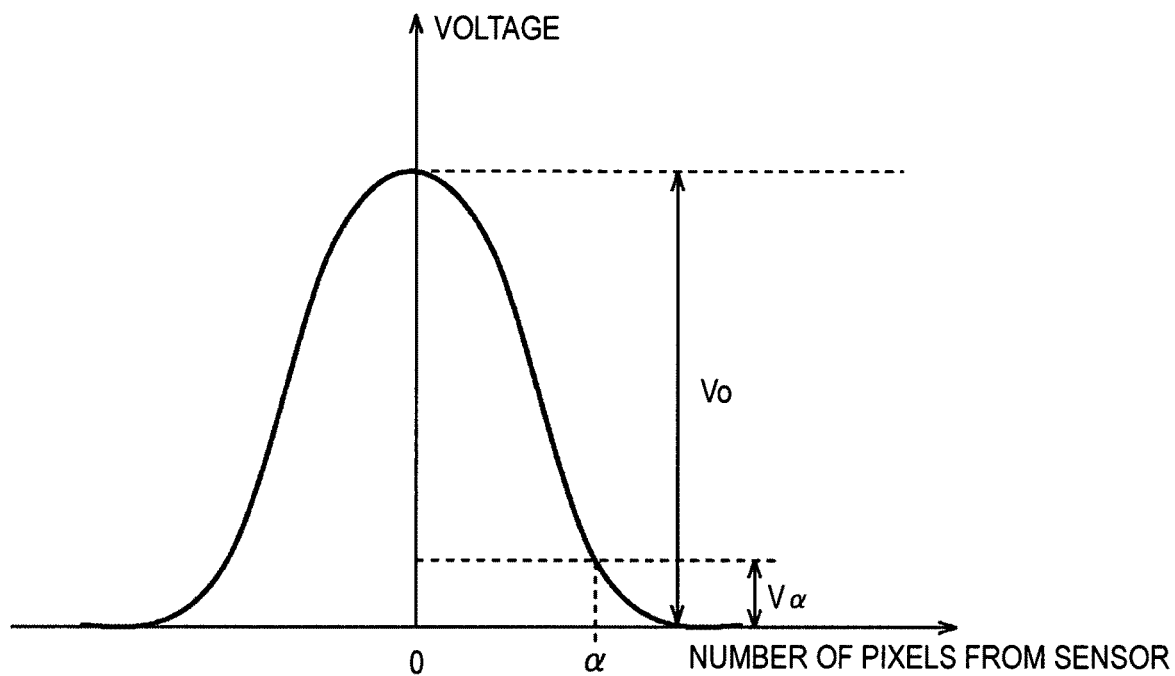
FIG. 9 is a graph of a relation of dependency between the output voltage of the light reception sensor 3 and a distance between the light reception sensor 3 and a pixel 101.

FIG. 9 is a graph of a relation of dependency between the output voltage of the light reception sensor 3 and a distance between the light reception sensor 3 and the pixel 101. In FIG. 9, the ordinate indicates the output voltage of the light reception sensor 3 and the abscissa indicates a distance in a predetermined direction from the light reception sensor 3 (the unit is the number of pixels).

Figure 10:
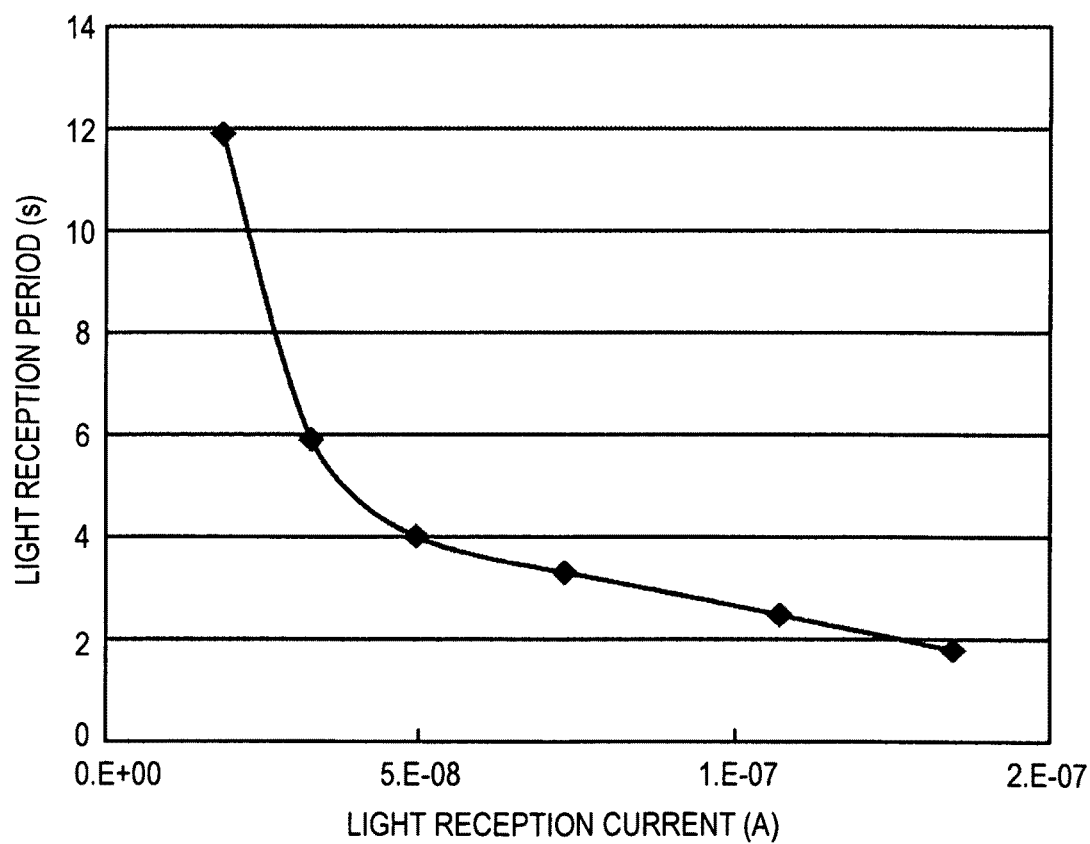
FIG. 10 is a graph of a relation between light reception time and a light reception current of the light reception sensor 3.

FIG. 10 is a graph of a relation between light reception time and a light reception current of the light reception sensor 3. In FIG. 10, the ordinate indicates reception time (s)

of the light reception sensor 3 and the abscissa indicates a light reception current (A) of the light reception sensor 3.

As shown in FIG. 9, when the pixel 101 distant from the light reception sensor 3 by 0 in terms of the number of pixels (hereinafter referred to as pixel 101 at the distance 0) is set as the pixel of attention P, the output voltage of the light reception sensor 3 is Vo. On the other hand, when the pixel 101 distant from the light reception sensor 3 by α (α is an integer value equal to or larger than 1) in terms of the number of pixels (hereinafter referred to as pixel 101 at the distance α) is set as the pixel of attention P, even if the light emission luminance of the pixel of attention P is the same as that of the pixel 101 at the distance 0, the output voltage of the light reception sensor 3 is $V_\alpha$, which far lower than Vo. The decrease in the output voltage of the light reception sensor 3 means that a light reception current of the light reception sensor 3 decreases. According to FIG. 10, the light reception sensor 3 has a characteristic that the light reception time increases as the light reception current decreases, i.e., a characteristic that response time until the output voltage is output increases.

However, such a characteristic is not taken into account in the past. This is a cause of the problem explained in the section of Summary of the Invention, i.e., the problem in that the processing time of the entire correction system is long. This is explained more in detail with reference to FIG. 11.

Figure 11:
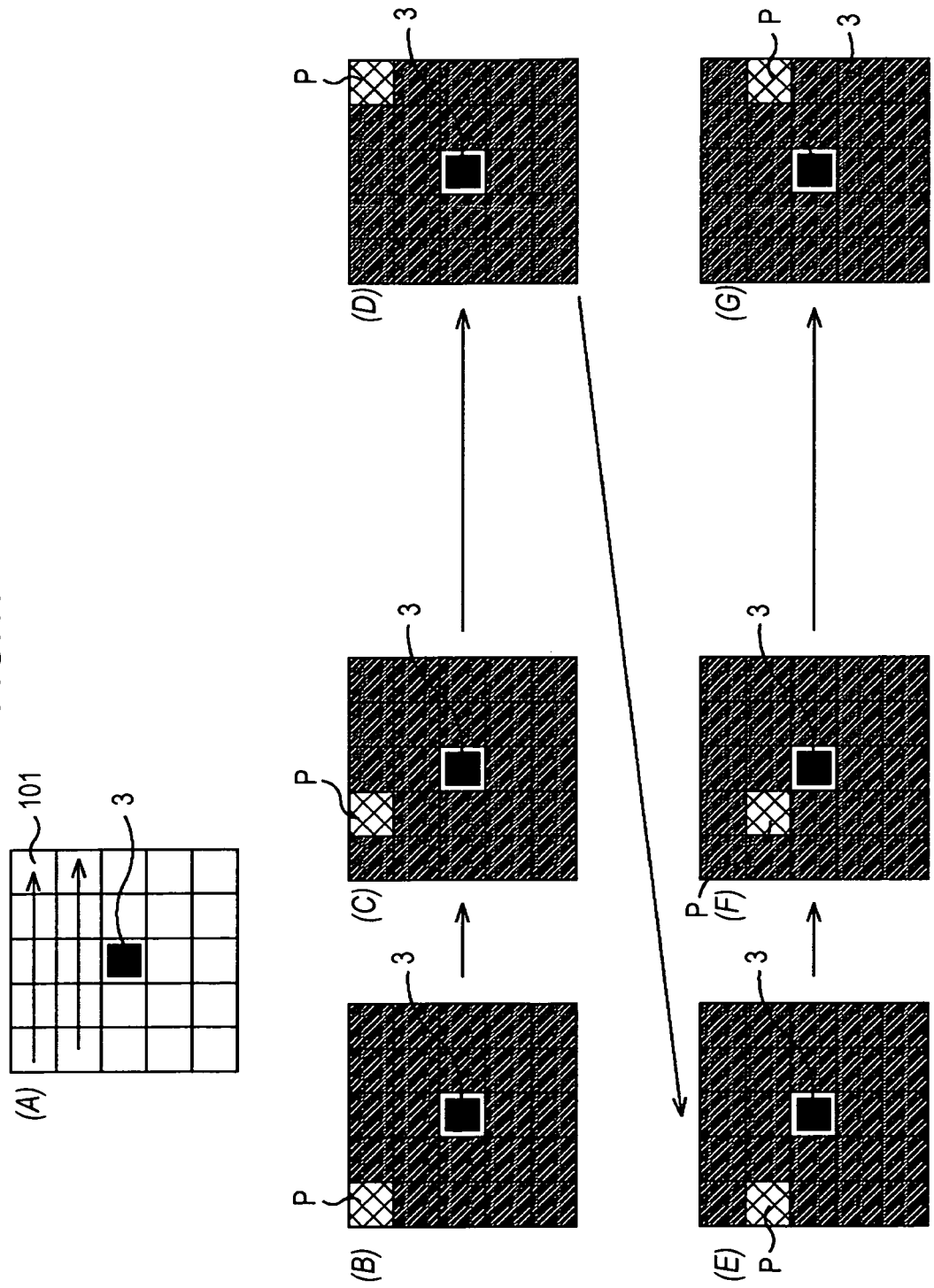
FIG. 11 is a diagram for explaining burning correction control in the past.

FIG. 11 is a diagram for explaining burning correction control in the past.

In A to G of FIG. 11, an area including 5×5 pixels 101 is shown. The light reception sensor 3 is arranged in the center of the area.

In A of FIG. 11, setting order for the pixel of attention P in the burning correction control is shown. When a processing target row is an ith row (in an example shown in FIG. 11, i is any one of integer values 1 to 5), each of the five pixels 101 arranged in the ith row is sequentially set as the pixel of attention P in order from the pixel 101 at the left end (in a first column) to the pixel 101 at the right end (in a fifth column). When the pixel 101 at the right end (in the fifth column) of the ith row is set as the pixel of attention P, the processing target row transitions to the next i+1th row. The pixel of attention P is sequentially set in order same as that in the ith row.

In this case, in the burning correction control in the past, the signal processing unit 53 causes only the pixel of attention P to emit light at predetermined gradation determined in advance. Specifically, the signal processing unit 53 quenches the other twenty-four pixels 101.

As shown in B of FIG. 11, first, a first row is set as the processing target row and the pixel 101 in a first column is set as the pixel of attention P. Therefore, only the pixel of attention P in the first row×the first column emits light at the predetermined gradation determined in advance. Then, the light reception sensor 3 outputs a light reception signal (a voltage signal) corresponding to the light reception luminance of the pixel of attention P to the control unit 5. The control unit 5 calculates correction data for the pixel of attention P on the basis of the light reception signal of the pixel of attention P and causes the memory 61 to store the correction data.

Subsequently, as shown in C of FIG. 11, the signal processing unit 53 sets the pixel 101 on the right of the pixel 101 in the first row×the first column that has been set as the pixel of attention P, i.e., the pixel 101 in the first row×the second column as the pixel of attention P. Therefore, only the pixel of attention P in the first row×the second column emits light at the predetermined gradation determined in advance. Then, the light reception sensor 3 outputs a light reception signal (a voltage signal) corresponding to the light reception luminance of the pixel of attention P to the control unit 5. The control unit 5 calculates correction data for the pixel of attention P on the basis of the light reception signal of the pixel of attention P and causes the memory 61 to store the correction data.

Thereafter, as shown in D to G of FIG. 11, the pixel of attention P is sequentially set in the order explained above and a light reception signal of the pixel of attention P is output from the light reception sensor 3. As a result, correction data for the pixel of attention P is calculated on the basis of the light reception signal of the pixel of attention P and stored in the memory 61.

Attention is paid to the pixel of attention P shown in B of FIG. 11 and the pixel of attention P shown in F of FIG. 11. In this case, a distance between the pixel of attention P shown in B of FIG. 11 and the light reception sensor 3 is longer than a distance between the pixel of attention P shown in F of FIG. 11 and the light reception sensor 3. Therefore, response time from the time when the light reception sensor 3 receives light from the pixel of attention P until the light reception sensor 3 outputs a light reception signal of the like is longer when the pixel of attention P is as shown in B of FIG. 11 than when the pixel of attention P is as shown in F of FIG. 11. As a result, a series of processing time from the time when the correction data for the pixel of attention P shown in B of FIG. 11 is generated until the correction data is stored in the memory 61 is longer than a series of processing time concerning the pixel of attention P shown in F of FIG. 11.

As a distance between the pixel 101 set as the pixel of attention P and the light reception sensor 3 increases, the series of processing time from the time when correction data for the pixel 101 is generated until the correction data is stored in the memory 61 is longer. Specifically, because the pixel 101 located at a long distance from the light reception sensor 3 is present as shown in B of FIG. 11, the response time of the entire burning correction system increases. In this way, the problem of the burning correction control in the past explained in the section of Summary of the Invention occurs.

Therefore, to solve this problem, i.e., to realize a reduction in processing time of the burning correction system, the inventor invented burning correction control method explained below. The inventor invented a burning correction control method for increasing the light reception intensity of the light reception sensor 3 with respect to the pixel 101 at a far distance from the light reception sensor 3 and performing burning correction. Such a method is hereinafter referred to as burning correction control method according to this embodiment.

Figure 12:
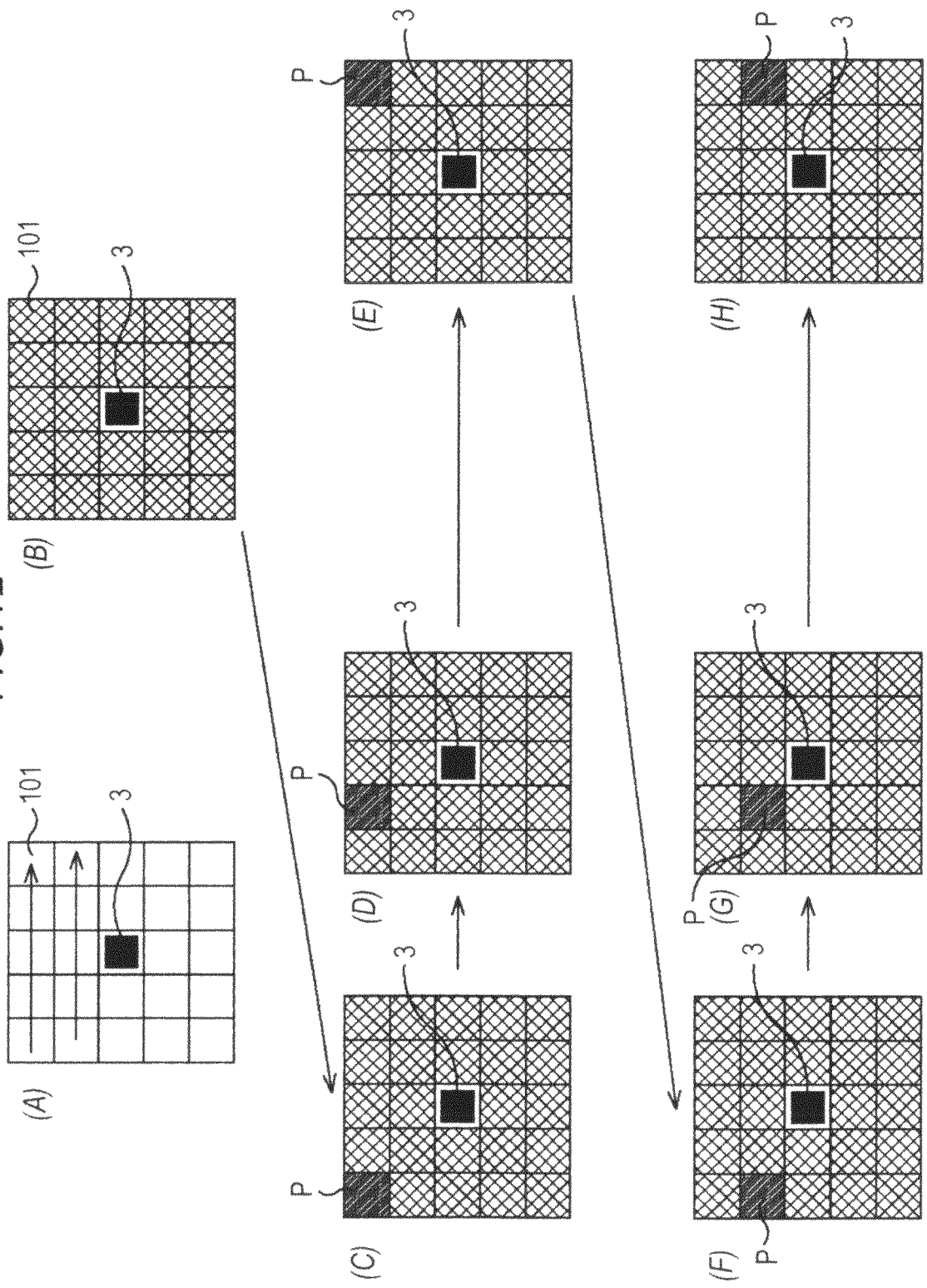
FIG. 12 is a diagram for explaining a first example of burning correction control method according to the embodiment.

First Example of the Burning Correction Control Method According to this Embodiment FIG. 12 is a diagram for explaining a first example of the burning correction control method according to this embodiment.

In A to H of FIG. 12, an area including 5×5 pixels 101 is shown. The light reception sensor 3 is arranged in the center of this area. In FIG. 12, a half-tone dot meshing pattern (a thin pattern) of patterns in a block indicating the pixel 101 indicates that the pixel 101 emits light at fixed gradation. On the other hand, a right hatching pattern (a thick pattern) indicates that the pixel 101 is quenched.

In the first example, the signal processing unit 53 performs the burning correction control after causing all the pixels 101 included in the area to emit lights. Consequently, it is possible to increase the light reception intensity of the light reception sensor 3 and reduce the light reception time of the light reception sensor 3, i.e., increase the response speed of the light reception sensor 3.

In A of FIG. 12, setting order for the pixel of attention P in the first example is shown. The setting order itself of the pixel of attention P is the same as the setting order for the pixel of attention P shown in A of FIG. 11.

As an initial state, as shown in B of FIG. 12, the signal processing unit 53 causes the pixels 101 included in the area to uniformly emit lights at predetermined gradation.

Thereafter, as shown in C to H of FIG. 12, the signal processing unit 53 sequentially sets the twenty-five (5×5) pixels 101 included in the area as the pixel of attention P one by one in the order explained above. The signal processing unit 53 sequentially quenches only the pixels 101 set as the pixel of attention P. In other words, the twenty-four pixels 101 other than the pixel of attention P maintains the light emission at the predetermine gradation.

In this way, in the initial state shown in B of FIG. 12, all the pixels 101 included in the area uniformly emit lights at the predetermined gradation. As a result, the respective lights emitted from the pixels 101 included in the area reach the light reception sensor 3. Therefore, the output voltage of the light reception sensor 3 (the voltage of a light reception signal) in the initial state indicates an integrated amount of all the lights reaching from these twenty-five (=5×5) pixels 101 (hereinafter referred to as all pixel light integrated amount). As shown in C to H of FIG. 12, if only the pixel of attention P is quenched, the output voltage of the light reception sensor 3 (the voltage of the light reception signal) is lower than the all pixel light integrated amount by an amount equivalent to the quenching of the pixel of attention P (light emission luminance of the pixel of attention P). Therefore, when a difference between the light reception signal of the light reception sensor 3 in the initial state and the light reception signal of the light reception sensor 3 in a state in which only the pixel of attention P is quenched (hereinafter referred to as a pixel of attention quenching state) is calculated, the light emission luminance of the pixel of attention P is obtained.

Therefore, in the first example, digital data obtained as a result of amplifying the light reception signal of the light reception sensor 3 in the initial state (the state shown in B of FIG. 12) and subjecting the light reception signal to the A/D conversion is stored in the memory 61 as offset data in advance. In this case, a value of the offset data is, for example, a value shown in FIG. 13 in terms of an analog signal (in a state before the A/D conversion).

Figure 13:
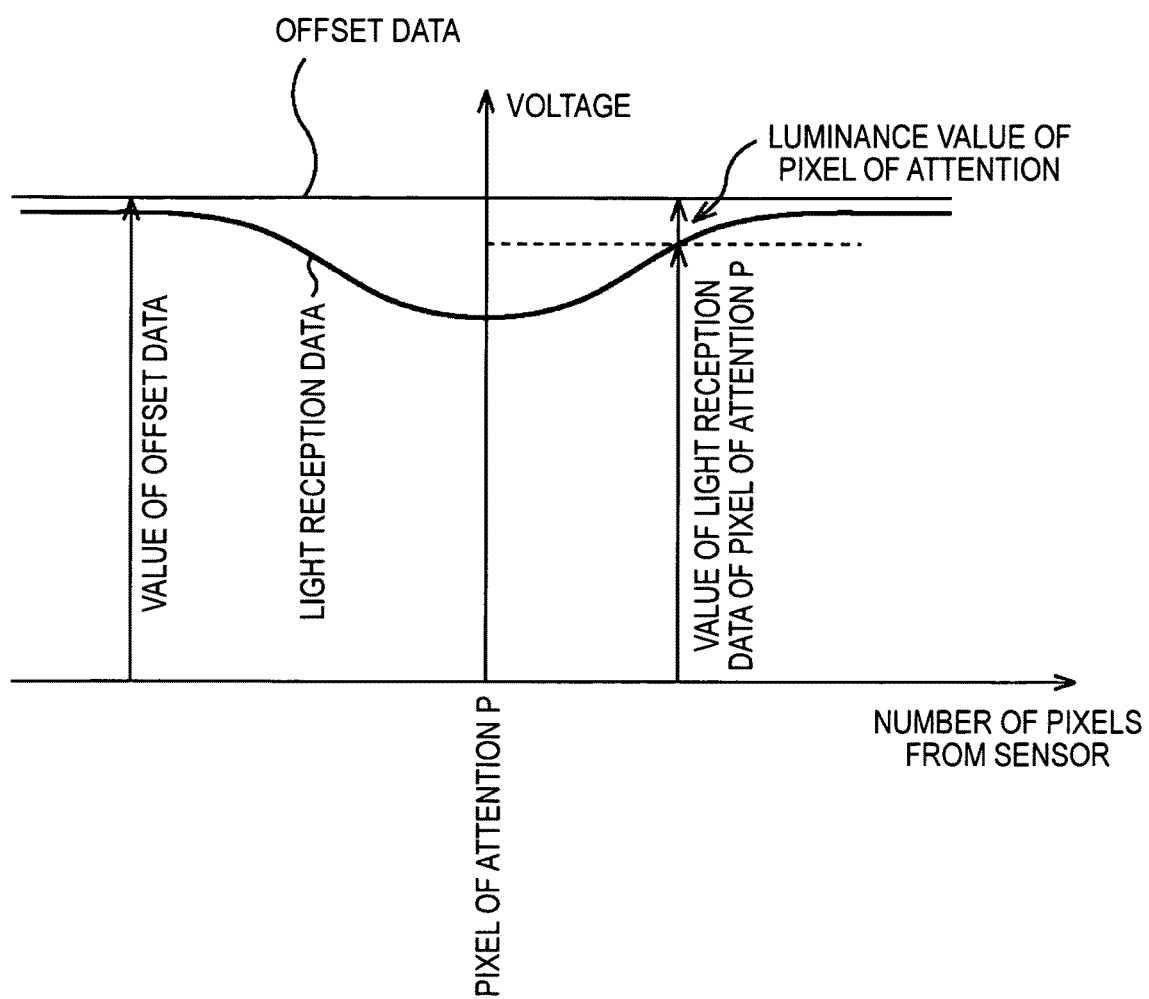
FIG. 13 is a graph for explaining a calculation method for a luminance value of a pixel of attention in the first example of the burning correction control method according to the embodiment.

FIG. 13 is a graph for explaining a calculation method for a luminance value of a pixel of attention in the first example of the burning correction control method according to this embodiment. In FIG. 13, the ordinate indicates voltage after amplification of the light reception signal of the light reception sensor 3 and the abscissa indicates a distance in a predetermined direction from the light reception sensor 3 (the unit is the number of pixels).

The digital data obtained as a result of amplifying the light reception signal of the light reception sensor 3 in the pixel of attention quenching state and subjecting the light reception signal to the A/D conversion is referred to as light reception data. In this case, an analog signal equivalent value of the light reception data (a value in a state before A/D conversion) is, as shown in FIG. 13, lower than the value of the offset data by a value equivalent to the quenching of the pixel of attention P (light emission luminance of the pixel of attention P). Therefore, the signal processing unit 53 can calculate a luminance value of the pixel of attention P by subtracting the value of the light reception data of the pixel of attention P from the value of the offset data.

In FIG. 13, the value of the light reception data is lower as the pixel of attention P is closer to the light reception sensor 3. This is because, as explained with reference to FIG. 9, even if the light emission luminances themselves of the pixels 101 are the same, a light reception amount sensed by the light reception sensor 30 is larger as the pixel of attention P is closer to the light reception sensor 3. In other words, a ratio of a light reception amount based on the light emission of the pixel of attention P in the all pixel light integrated value is higher as the pixel of attention P is closer to the light reception sensor 3.

What should be noted is that, even when the pixel 101 distant from the light reception sensor 3 is set as the pixel of attention P, a value of reception data keeps a value equal to or larger than a fixed value, i.e., keeps a value close to the value of the offset data. In other words, the output voltage of the light reception sensor 3 (the voltage of the light reception signal) in the pixel of attention quenching state keeps a value equal to or larger than a fixed value irrespective of a distance between the light reception sensor 3 and the pixel of attention P. This means that the light reception sensor 3 can typically output a light reception signal at response speed equal to or higher than fixed speed irrespective of the distance between the light reception sensor 3 and the pixel of attention P. Therefore, when the processing time of the entire burning correction system is comprehensively compared with that in the past, a reduction in the processing time can be realized. In other words, the problem explained above can be solved.

As explained above, a luminance value of the pixel of attention P can be calculated as long as only a difference between the luminance value and the value of the offset data can be measured. Therefore, rather than quenching the pixel of attention P, the pixel of attention P may be caused to emit light at gradation lower than the gradation of the light emission luminance of the pixels 101 around the pixel of attention P.

[Initial Data Acquisition Processing to Which the First Example of the Burning Correction Control Method According to this Embodiment is Applied]

Figure 14:
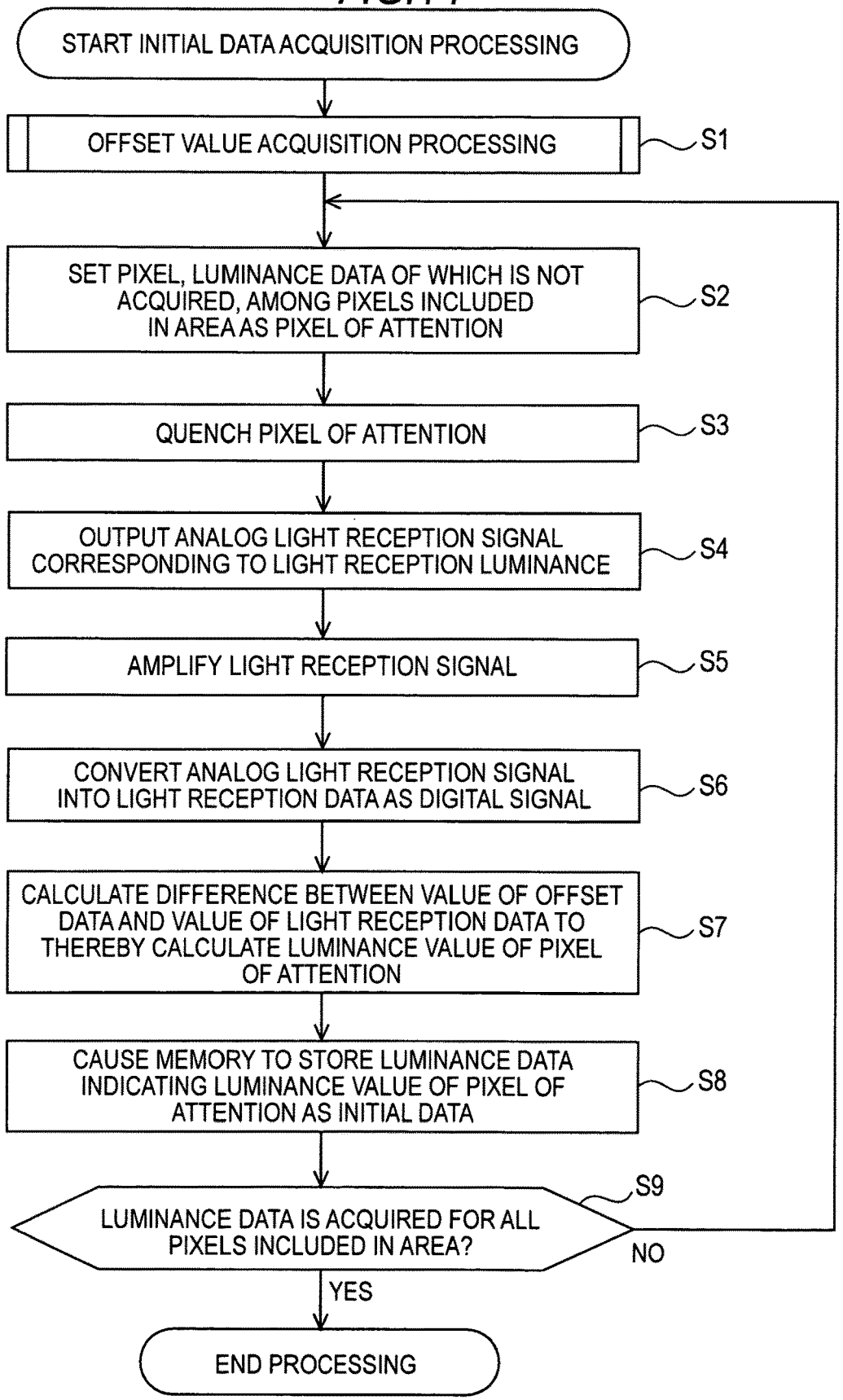
FIG. 14 is a flowchart for explaining an example of initial data acquisition processing for realizing the first example of the burning correction control method according to the embodiment.

FIG. 14 is a flowchart for explaining an example of a series of processing until initial data for realizing the first example of the burning correction control method according to this embodiment is acquired (hereinafter referred to as initial data acquisition processing) in the processing executed by the display device 1.

The initial data acquisition processing of the example shown in FIG. 14 is executed, for example, in parallel for each of the sectioned areas of the EL panel 2. In other words, the initial data acquisition processing shown in FIG. 14 is executed in parallel for each of the light reception sensors 3.

In step S1, the signal processing unit 53 generates the offset data explained with reference to FIG. 13 and causes the memory 61 to store the offset data. A series of processing until the offset data is generated and stored in the memory 61 is hereinafter referred to as offset value acquisition processing. A detailed example of the offset value acquisition processing is explained with reference to FIG. 15.

[Offset Value Acquisition Processing]

Figure 15:
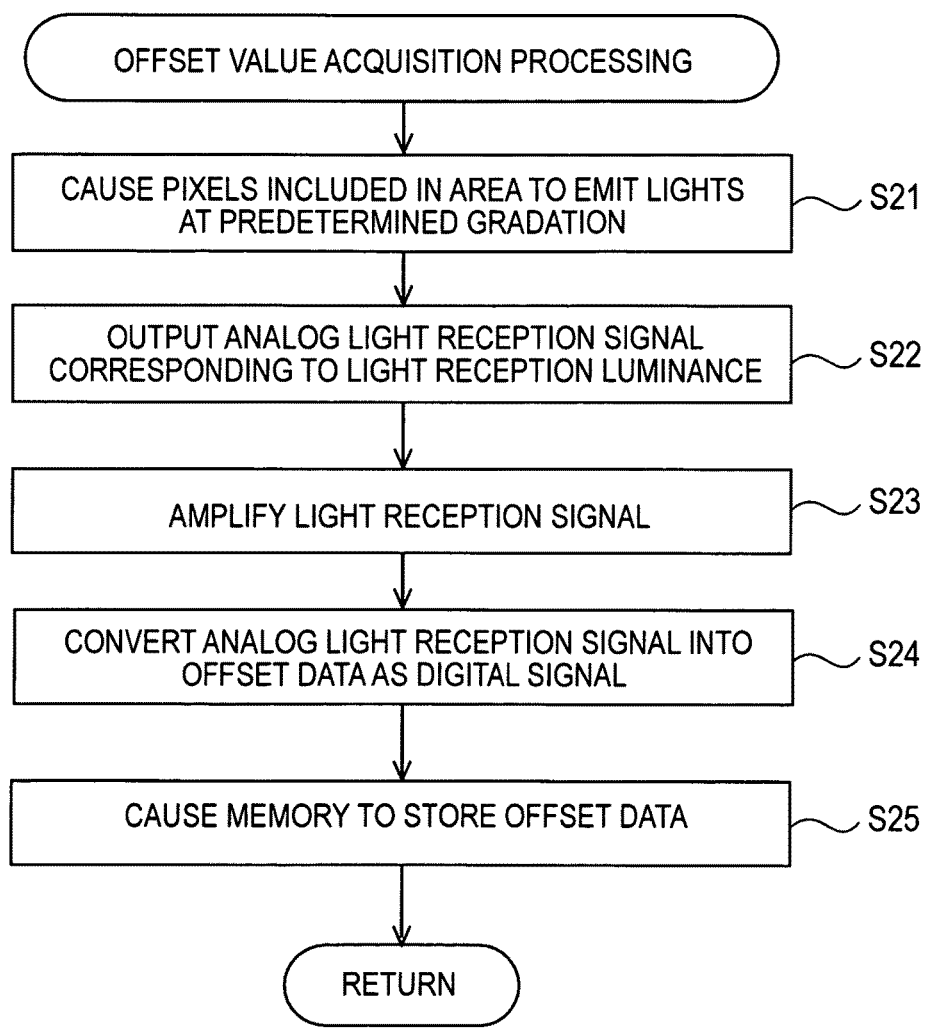
FIG. 15 is a flowchart for explaining an example of offset value acquisition processing according to the embodiment.

FIG. 15 is a flowchart for explaining an example of the offset value acquisition processing according to this embodiment.

In step S21, the signal processing unit 53 causes the pixels 101 included in the area to emit lights at predetermined gradation.

In step S22, the light reception sensor 3 outputs an analog light reception signal (a voltage signal) corresponding to the light reception luminance of the entire pixels 101 included in the area to the amplifying unit 51 of the control unit 5.

In step S23, the amplifying unit 51 amplifies the light reception signal of the light reception sensor 3 at a predetermined amplification ratio and supplies the light reception signal to the A/D conversion unit 52.

In step S24, the A/D conversion unit 52 converts the amplified analog light reception signal into offset data as a digital signal and supplies the offset data to the signal processing unit 53.

In step S25, the signal processing unit 53 causes the memory 61 to store the offset data.

Consequently, the offset value acquisition processing ends. In this case, the processing in step S1 of FIG. 14 ends and the processing proceeds to step S2.

In step S2, the signal processing unit 53 sets the pixel 101, luminance data of which is not acquired, among the pixels 101 included in the area as the pixel of attention P. A setting order for the pixel of attention P is as explained with reference to A of FIG. 12.

In step S3, the signal processing unit 53 quenches the pixel of attention P. As shown in C to H of FIG. 12, only the pixel of attention P among the pixels 101 included in the area is quenched. The other pixels 101 maintain light emission.

In step S4, the light reception sensor 3 outputs an analog light reception signal (a voltage signal) corresponding to the light reception luminance of the entire pixels 101 excluding the pixel of attention P among the pixels 101 included in the area to the amplifying unit 51 of the control unit 5.

In step S5, the amplifying unit 51 amplifies the light reception signal of the light reception sensor 3 at a predetermined amplification ratio and supplies the light reception signal to the A/D conversion unit 52.

In step S6, the A/D conversion unit 52 converts the amplified analog light reception signal into light reception data as a digital signal and supplies the light reception signal to the signal processing unit 53.

In step S7, the signal processing unit 53 calculates a difference between a value of the offset data and a value of the light reception data to thereby calculate a luminance value of the pixel of attention P (see FIG. 13).

In step S8, the signal processing unit 53 causes the memory 61 to store luminance data indicating the luminance value of the pixel of attention P as initial data.

In step S9, the signal processing unit 53 determines whether luminance data is acquired for all the pixels 101 included in the area. When it is determined in step S9 that luminance data is not acquired for all the pixels 101 included in the area, the processing is returned to step S2 and loop processing of the processing in steps S2 to S9 is repeated. Specifically, each of the pixels 101 included in the area is sequentially set as the pixel of attention P and such loop processing is repeatedly executed, whereby initial data of all the pixels 101 included in the area is acquired and stored in the memory 61.

Consequently, it is determined in step S9 that luminance data is acquired for all the pixels 101 included in the area. The initial data acquisition processing ends.

[Correction Data Acquisition Processing to Which the First Example of the Burning Correction Control Method According to this Embodiment is Applied]

Figure 16:
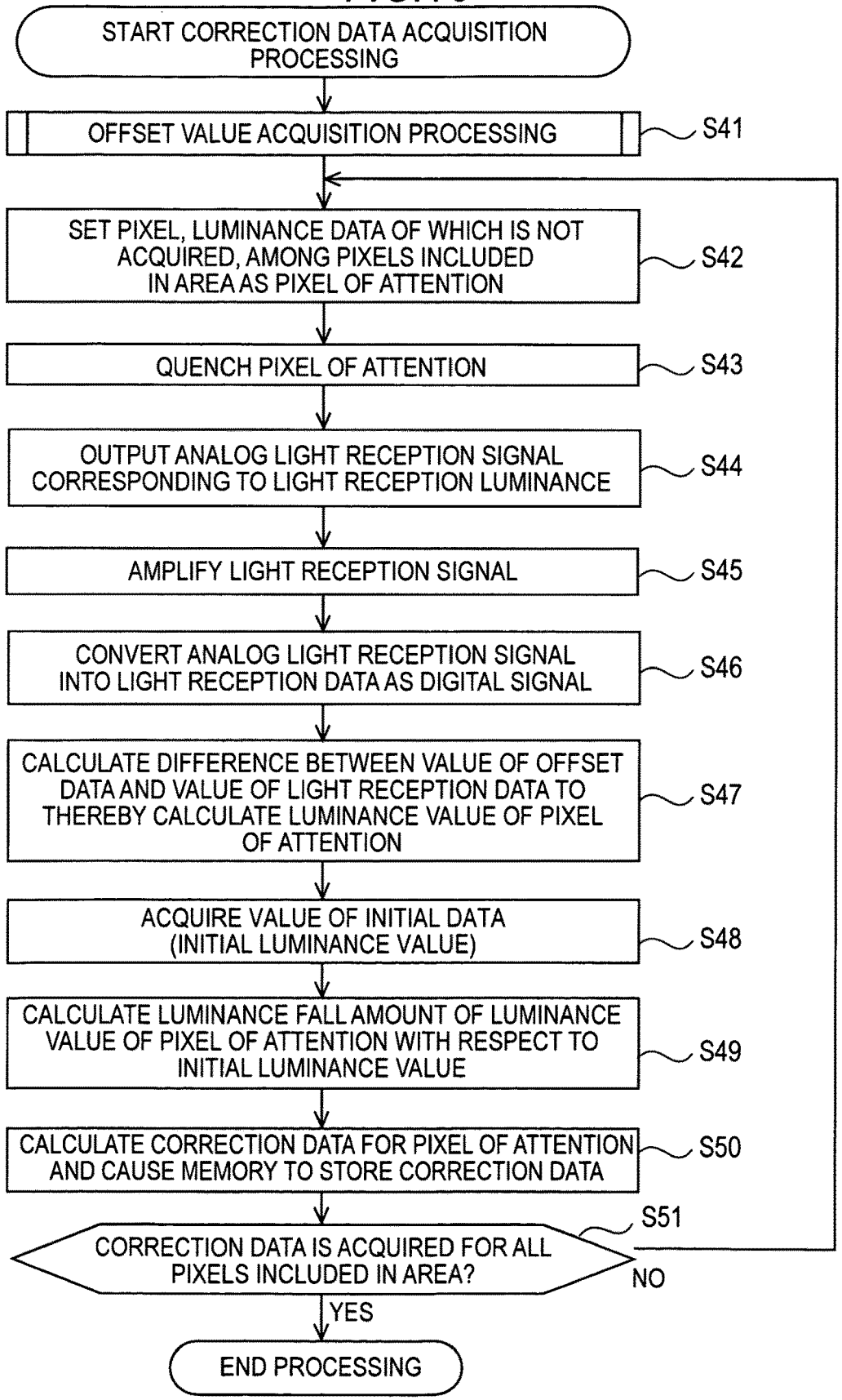
FIG. 16 is a flowchart for explaining an example of correction data acquisition processing executed when a predetermined period elapses after the initial data acquisition processing shown in FIG. 14 is performed.

FIG. 16 is a flowchart for explaining an example of processing executed when a predetermined period elapses after the initial data processing shown in FIG. 14 is performed, which is a series of processing until correction data is acquired (hereinafter referred to as correction data acquisition processing). Like the initial data processing shown in FIG. 14, the correction data acquisition processing is also executed in parallel for each of the sectioned areas of the EL panel 2.

Processing in steps S41 to S47 is the same as the processing in steps S1 to S7 shown in FIG. 14 explained above. Therefore, explanation of the processing is omitted. A luminance value of the pixel of attention P is acquired by the processing in step S41 to S47 under a condition same as that for the initial data acquisition processing.

What should be noted is that, in the correction data acquisition processing, the offset value acquisition processing shown in FIG. 15 is executed again separately from the initial data acquisition processing. Specifically, as explained with reference to FIG. 12, after the pixels 101 included in the area are caused to uniformly emit lights, only the pixel of attention P is quenched, whereby a luminance value of the pixel of attention P is acquired.

The "predetermined gradation" in step S21 of the offset value acquisition processing is different in the initial data acquisition processing shown in FIG. 14 and the correction data acquisition processing shown in FIG. 16 in terms of gradations of luminances actually generated by the pixels 101 because the pixels 101 are deteriorated. However, in terms of target gradations given to the pixels 101, as the "predetermined gradation" in step S21 of the offset value acquisition processing, the same gradation is adopted in the initial data acquisition processing shown in FIG. 14 and the correction data acquisition processing shown in FIG. 16.

Similarly, the "predetermined gradation" in step S43 is different from the "predetermined gradation" in step S3 of the initial data acquisition processing shown in FIG. 14 in terms of a gradation of luminance actually generated by the pixel of attention P because the pixels 101 set as the pixel of attention P are deteriorated. However, in terms of a target gradation given to the pixel of attention P, as the "predetermined gradation" in step S43, a gradation same as the "predetermined gradation" in step S3 of the initial data acquisition processing shown in FIG. 14 is adopted.

In step S48, the signal processing unit 53 acquires a value of the initial data (an initial luminance value) of the pixel of attention P from the memory 61.

In step S49, the signal processing unit 53 calculates a luminance fall amount of the luminance value of the pixel of attention P with respect to the initial luminance value.

In step S50, the signal processing unit 5 calculates correction data for the pixel of attention P on the basis of the luminance fall amount of the pixel of attention P and causes the memory 61 to store the correction data.

In step S51, the signal processing unit 53 determines whether correction data is acquired for all the pixels 101 included in the area. When it is determined in step S51 that correction data is not acquired for all the pixels 101 included in the area, the processing is returned to step S42 and loop processing of the processing in steps S42 to S51 is repeated. Specifically, each of the pixels 101 included in the area is sequentially set as the pixel of attention P and such loop processing is repeatedly executed, whereby correction data for all the pixels 101 included in the area is acquired and stored in the memory 61.

Consequently, it is determined in step S51 that correction data is acquired for all the pixels 101 included in the area. The correction data acquisition processing ends.

As explained above, when the correction data acquisition processing shown in FIG. 16 is executed when predetermined time elapses after the execution of the initial data acquisition processing shown in FIG. 14, correction data concerning the pixels 101 of the pixel array unit 102 is stored in the memory 61. Thereafter, the correction data is updated and stored in the memory 61 every time the correction data acquisition processing is executed.

Consequently, under the control by the signal processing unit 53, the signal potential Vsig, a luminance fall of which due to aged deterioration is corrected by the correction data, is supplied to the pixels 101 of the pixel array unit 102 as signal potential of the video signal. Specifically, the signal processing unit 53 can control the horizontal selector 103 to supply the signal potential Vsig added with a potential by the correction data to the pixels 101 as signal potential of the video signal input to the display device 1.

The correction data stored in the memory 61 may be a value for multiplying the signal potential of the video signal input to the display device 1 with a predetermined ratio or may be a value for offsetting a predetermined voltage value. It is also possible to store the correction data as a correction table corresponding to the signal potential of the video signal input to the display device 1. In other words, a form of the correction data stored in the memory 61 is not specifically limited.

Second Example of the Burning Correction Control According to this Embodiment

A second example of the burning correction control according to this embodiment is explained.

In the first example explained with reference to FIG. 12, in the initial state (the state shown in B of FIG. 12), the light emission luminances of the pixels 101 included in the area (more accurately, since deterioration degrees of the pixels 101 are different, target luminance values) are uniformly set to the same gradation. However, in this case, as shown in FIG. 13, when the pixel 101 close to the light reception sensor 3 is set as the pixel of attention P, a value of light reception data is low compared with the pixel 101 in the distance. Consequently, the response time of the light reception sensor 3, i.e., time until a light reception signal is output is longer when the close pixel 101 is quenched compared with when the distant pixel 101 is quenched. In other words, the response time of the light reception sensor 3 varies depending on an arrangement position of the pixel 101 set as the pixel of attention P. Therefore, in the initial state, i.e., in the processing in step S21 of the offset value acquisition processing (see FIG. 15), the pixel 101 more distant from the light reception sensor 3 is set brighter rather than uniformly setting the light emission luminances of the pixels 101 included in the area. Specifically, for example, the light emission luminances may be set as shown in B of FIG. 17.

Figure 17:
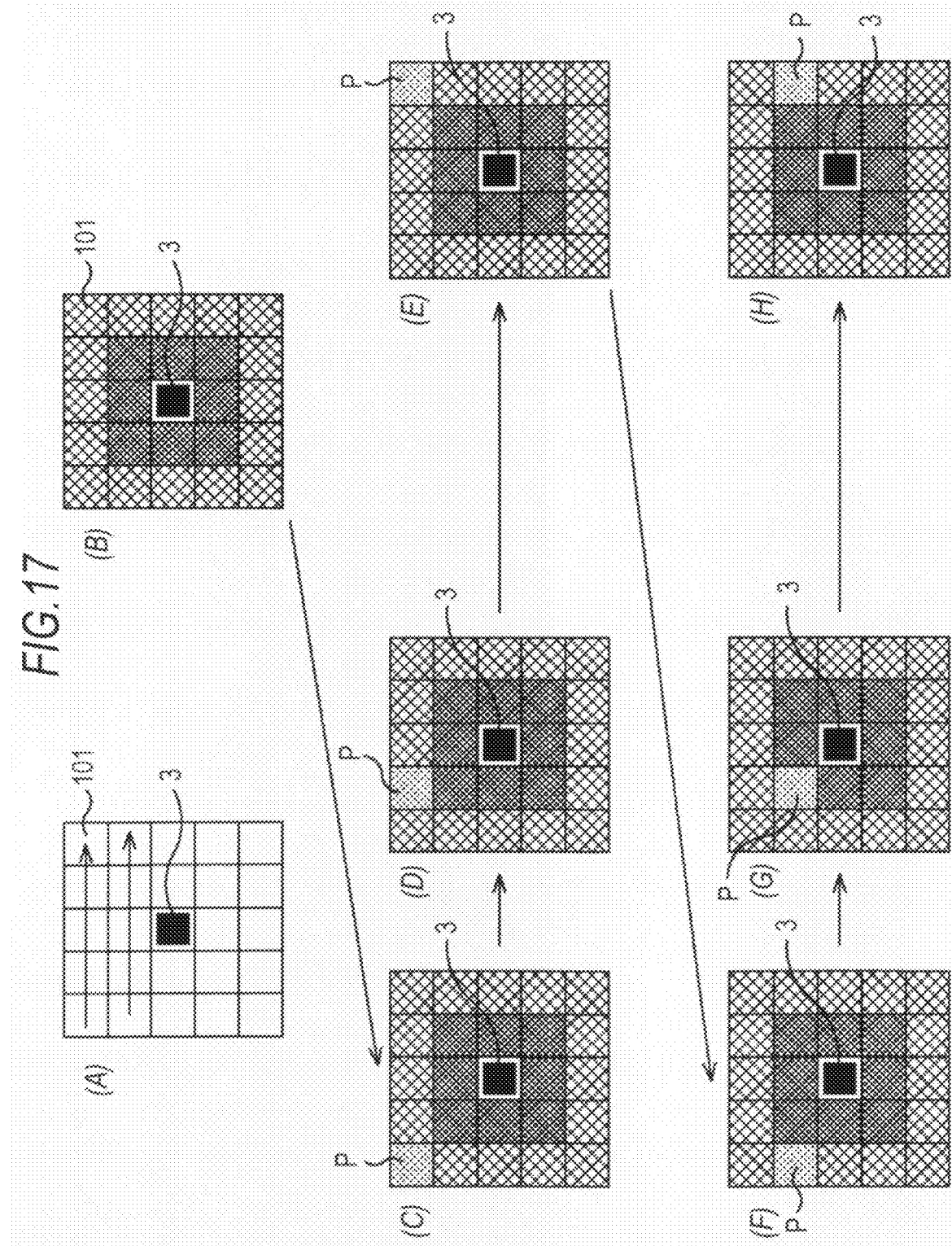
FIG. 17 is a diagram for explaining a second example of a burning correction control method according to the embodiment.

FIG. 17 is a diagram for explaining the second example of the burning correction control method according to this embodiment.

In A to H of FIG. 17, an area including 5×5 pixels 101 is shown. The light reception sensor 3 is arranged in the center of this area. In FIG. 17, thin patterns (thinnest patterns in FIG. 17) among hatched patterns in patterns in blocks indicating the pixels 101 indicate that the pixel of attention P emits light at a fixed first gradation. Thick patterns (patterns thicker than the thinnest patterns in FIG. 17) among the hatched patterns indicate that the pixel of attention P emits light at a fixed second gradation. The second gradation is a gradation darker than the first gradation. A dot pattern indicates that the pixel of attention P is quenched. It should be note that the first gradation and the second gradation in FIG. 17 are not always the same as the first gradation and the second gradation in other figures.

In the second example, as in the first example, the burning correction control is performed after causing all the pixels 101 included in the area to emit lights. Therefore, in the second example, as in the first example, the light reception intensity of the light reception sensor 3 can be increased and the light reception time of the light reception sensor 3 can be reduced, i.e., the response speed of the light reception sensor 3 can be increased.

A of FIG. 17 indicates setting order for the pixel of attention P in the second example. The setting order itself for the pixel of attention P is the same as that in the first example shown in A of FIG. 12.

As an initial state, as shown in B of FIG. 17, the signal processing unit 53 causes each of the pixels 101 included in the area to emit light at a gradation that becomes brighter farther away from the light reception sensor 3 (brighter in terms of gradation).

As it is seen when C to H of FIG. 17 and C to H of FIG. 12 are compared, subsequent processing in the second example is the same as the processing in the first example. Therefore, in the second example, as in the first example, the processing conforming to the flowcharts shown in FIGS. 14 to 16 can be directly applied.

Third Example of the Burning Correction Control According to this Embodiment

A third example of the burning correction control according to this embodiment is explained.

As explained in the first and second examples, in the burning correction control according to this embodiment, as the initial state, the offset data is generated on the basis of the value of the light reception signal of the light reception sensor 3 obtained when the pixels 101 included in the area are caused to emit lights. The luminance value of the pixel of attention P is calculated from the difference between the value of the offset data and the value of the light reception data. The light reception data is not limited to the first and second examples. Such a difference only has to be calculated from the light reception data. In the first and second examples, as shown in FIG. 13, the light reception data having a value lower than the value of the offset data is adopted. On the other hand, in the third example, light reception data having a value higher than the value of the offset data is adopted.

Figure 18:
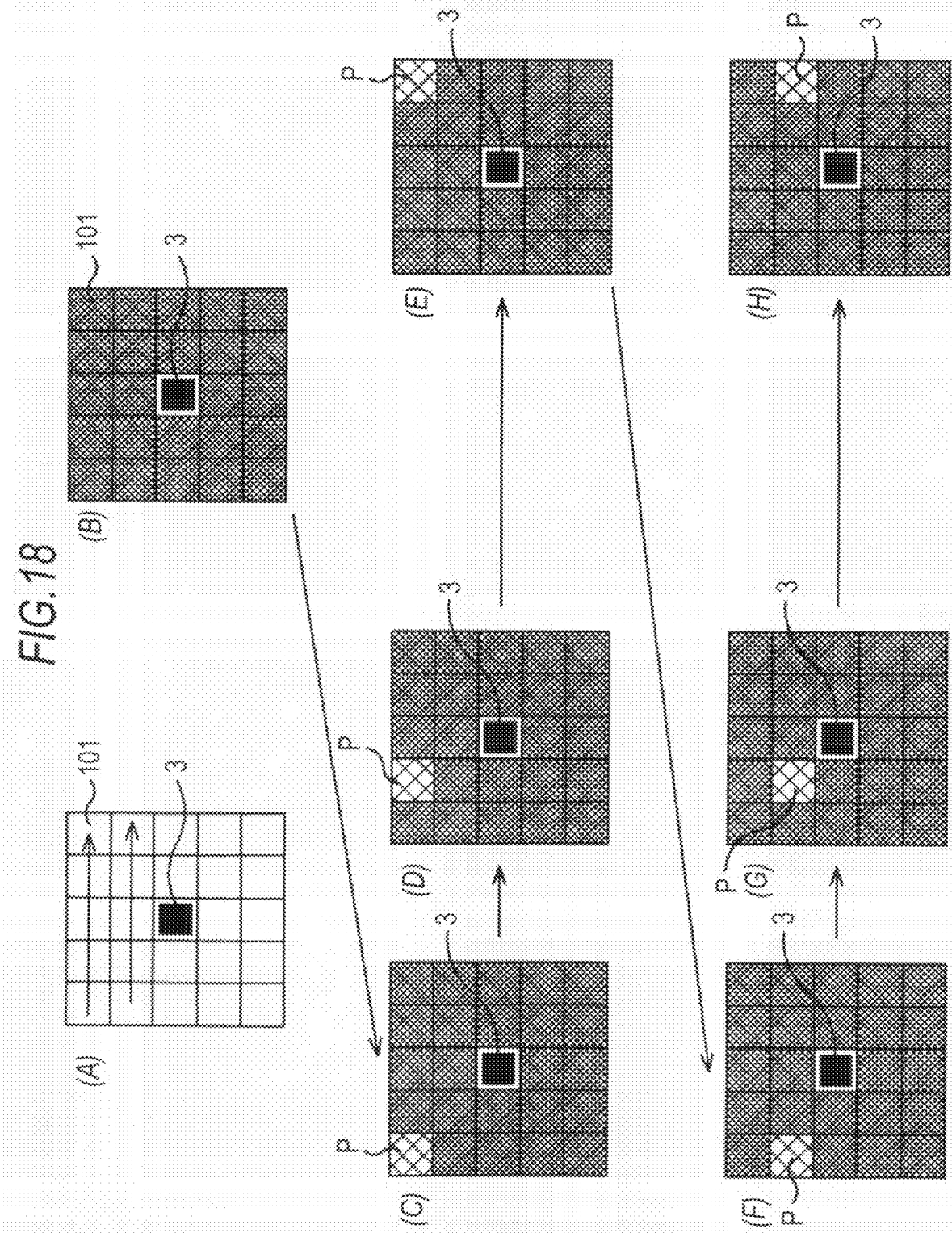
FIG. 18 is a diagram for explaining a third example of the burning correction control method according to the embodiment.

FIG. 18 is a diagram for explaining the third example of the burning correction control method according to this embodiment.

In A to H of FIG. 18, an area including 5×5 pixels 101 is shown. The light reception sensor 3 is arranged in the center of this area. In FIG. 18, a thin pattern among hatched patterns in patterns in blocks indicating the pixels 101 indicates that the pixel of attention P emits light at a fixed first gradation. Thick patterns among the hatched patterns indicate that the pixel of attention P emits light at a fixed second gradation. The second gradation is a gradation darker than the first gradation. It should be note that the first gradation and the second gradation in FIG. 18 are not always the same as the first gradation and the second gradation in other figures.

Setting order for the pixel of attention P in the third example is shown in A of FIG. 18. The setting order itself for the pixel of attention P is the same as those in the first example shown in A of FIG. 12 and the second example shown in A of FIG. 17.

As an initial state, as shown in B of FIG. 18, the signal processing unit 53 causes the pixels 101 included in the area to uniformly emit lights at a predetermined gradation. The uniform gradation of the pixels 101 in the third example is suitably a dark gradation compared with that in the initial state in the first example shown in B of FIG. 12. This is because, whereas the pixel of attention P is quenched or the pixel of attention P is caused to emit light darker than that in the initial state in the first example, in the third example, the pixel of attention P is caused to emit light brighter than that in the initial state.

Specifically, after the initial state, as shown in C to H of FIG. 18, the signal processing unit 53 sequentially sets the twenty-five (5×5) pixels 101 included in the area one by one as the pixel of attention P in the order explained above. The signal processing unit 53 sequentially causes only the pixel 101 set as the pixel of attention P to emit light at a gradation brighter than the predetermined gradation in the initial state. In other words, the twenty-four pixels 101 other than the pixel of attention P maintain the light emission at the predetermined gradation in the initial state.

As it is seen when C to H of FIG. 18 and C to H of FIG. 12 or FIG. 17 are compared, subsequent processing in the third example is the same as the processing in the first and second examples. However, in the third example, the signal processing unit 53 sequentially causes only the pixel 101 set as the pixel of attention P to emit light at a gradation brighter than the predetermined gradation in the initial state.

In this way, in the initial state shown in B of FIG. 18, all the pixels 101 included in the area uniformly emit lights at the predetermined gradation. Therefore, the output voltage of the light reception sensor 3 (the voltage of the light reception signal) in the initial state indicates an all pixel light integrated amount. As shown in C to H of FIG. 18, when only the pixel of attention P is caused to emit light at a gradation brighter than the predetermined gradation in the initial state, the output voltage of the light reception sensor 3 (the voltage of the light reception signal) is higher than the all pixel light integrated amount by an amount of the light emission of the pixel of attention P (the light emission luminance of the pixel of attention P). Therefore, when a difference between a light reception signal of the light reception sensor 3 in a pixel of attention light emission state in which only the pixel of attention P is caused to emit light at a gradation brighter than the predetermined gradation in the initial state and the light reception signal of the light reception sensor 3 in the initial state is calculated, the light emission luminance of the pixel of attention P is obtained.

Therefore, in the third example, digital data obtained as a result of amplifying the light reception signal of the light reception sensor 3 in the initial state (the state shown in B of FIG. 18) and subjecting the light reception signal to the A/D conversion is stored in the memory 61 in advance as offset data. In this case, a value of the offset data is, for example, a value shown in FIG. 19 in terms of an analog signal (in a state before the A/D conversion).

Figure 19:
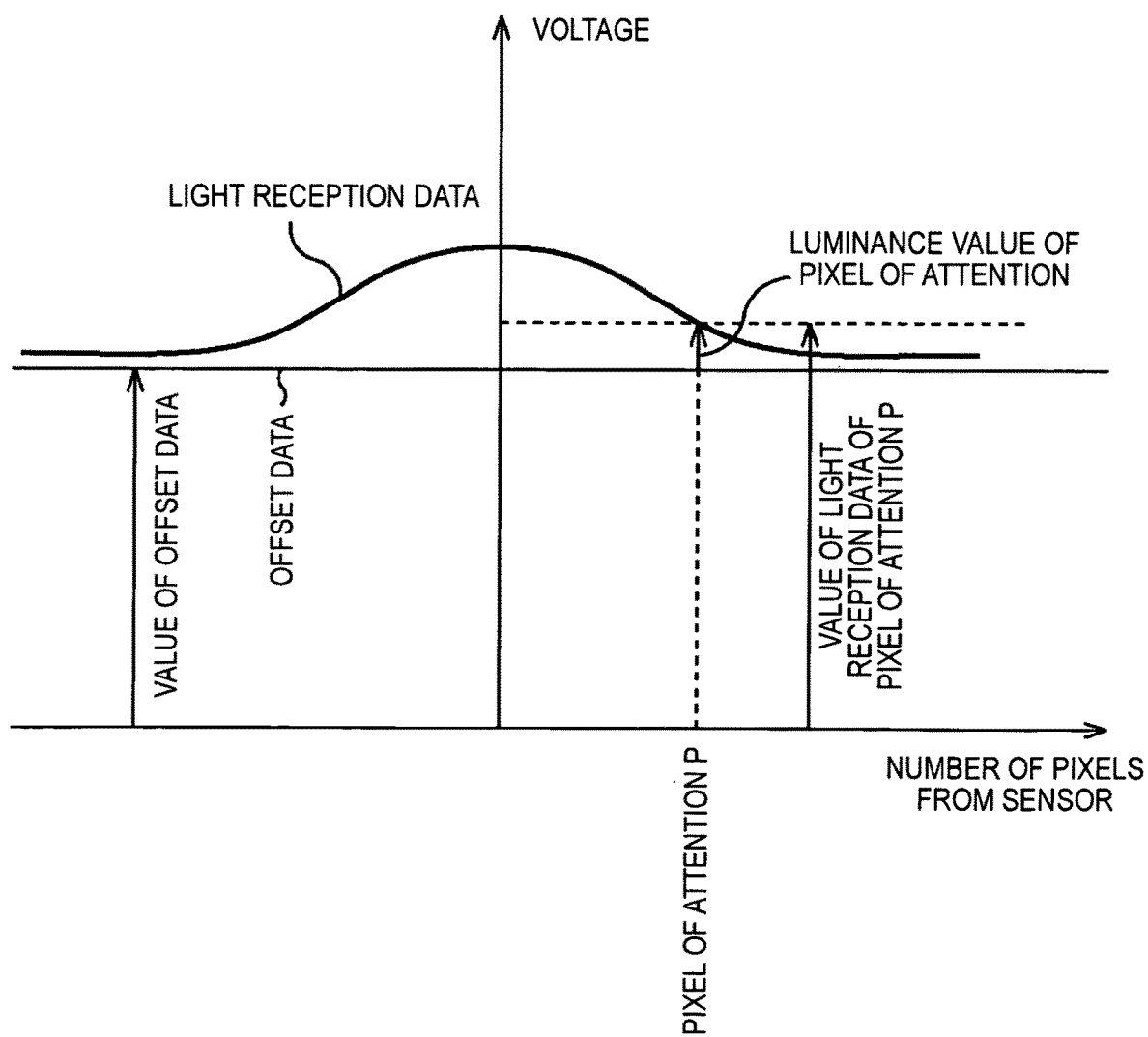
FIG. 19 is a graph for explaining a calculation method of a luminance value of a pixel of attention in the third example of the burning correction control method according to the embodiment.

FIG. 19 is a graph for explaining a calculation method for a luminance value of a pixel of attention in the third example of the burning correction control method according to this embodiment. In FIG. 19, the ordinate indicates the voltage of an amplified light reception signal of the light reception sensor 3 and the abscissa indicates a distance in a predetermined direction from the light reception sensor 3 (the unit is the number of pixels).

Digital data obtained as a result of amplifying a light reception signal of the light reception sensor 3 in the pixel of attention light emission state and subjecting the light reception signal to the A/D conversion, i.e., an analog signal equivalent value (a value in a state before the A/D conversion) of light reception data is as shown in FIG. 19. As shown in FIG. 19, the analog signal equivalent value of the light reception data is higher than the value of the offset data by an amount of light emission of the pixel of attention P at a gradation brighter than the predetermined gradation in the initial state (the light emission luminance of the pixel of attention P). Therefore, the signal processing unit 53 can calculate a luminance value of the pixel of attention P by subtracting the value of the offset data from the value of the light reception data.

In FIG. 19, the value of the light reception data is higher as the pixel of attention P is closer to the light reception sensor 3. This is because, as explained with reference to FIG. 9, even if the light emission luminances themselves of the pixels 101 are the same, a light reception amount sensed by the light reception sensor 3 is larger as the pixel 101 set as the pixel of attention P is closer to the light reception sensor 3.

What should be noted is that, as in the first example, a value equal to or larger than a fixed value is secured as the output voltage of the light reception sensor 3 (the voltage of the light reception signal) in the pixel of attention light emission state irrespective of a distance between the light reception sensor 3 and the pixel of attention P, i.e., in the third example, at least a value equal to or larger than the value of the offset data is secured. This means that the light reception sensor 3 can typically output the light reception signal at response speed equal to or higher than fixed speed irrespective of the distance between the light reception sensor 3 and the pixel of attention P. Therefore, when the processing time of the entire burning correction system is comprehensively compared with that in the past, a reduction in the processing time can be realized. In other words, in the third example, as in the first and second examples, the problem explained above can be solved.

[Initial Data Acquisition Processing to Which the Third Example of the Burning Correction Control Method According to this Embodiment is Applied]

Figure 20:
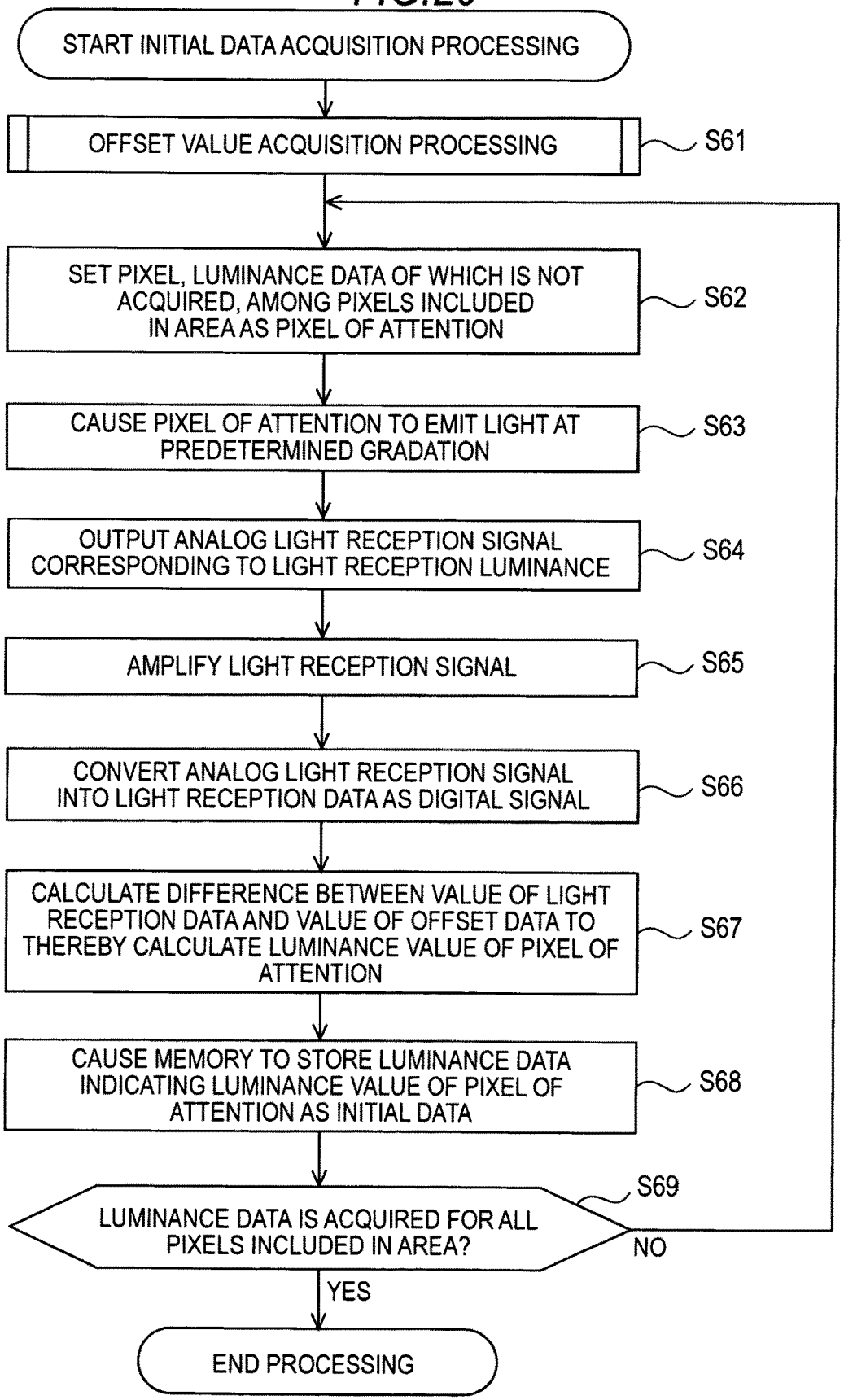
FIG. 20 is a flowchart for explaining an example of initial data acquisition processing for realizing the third example of the burning correction control method according to the embodiment.

FIG. 20 is a flowchart for explaining an example of initial data acquisition processing for realizing the third example of the burning correction control method according to this embodiment in the processing executed by the display device 1.

The initial data acquisition processing of the example shown in FIG. 20 is executed, for example, in parallel for each of the sectioned areas of the EL panel 2. In other words, the initial data acquisition processing shown in FIG. 20 is executed in parallel for each of the light reception sensors 3.

As it is easily seen when FIGS. 20 and 14 are compared, a series of flows of the initial data acquisition processing of the example shown in FIG. 20 is basically the same as the series of flows of the initial data acquisition processing of the example shown in FIG. 14. Therefore, only processing different from the initial data acquisition processing of the example shown in FIG. 14 in the initial data acquisition processing of the example shown in FIG. 20 is explained below.

In the first step S61, the offset value acquisition processing is executed as in the processing in step S1 shown in FIG. 14. A processing in step S61, the offset value acquisition processing shown in FIG. 15 is executed. However, the "predetermined gradation" in the processing in step S21 shown in FIG. 15 is, as explained above, a gradation that is darker in the case of the offset value acquisition processing as step S61 of the example shown in FIG. 20 than the case of the offset value acquisition processing as step S1 of the example shown in FIG. 14.

Therefore, whereas the processing for "quenching a pixel of attention" is adopted as the processing in step S3 of the example shown in FIG. 14, processing for "causing a pixel of attention to emit light at a predetermined gradation" is adopted as the processing in step S63 of the example shown in FIG. 20. The "predetermined gradation" in step S63 is a gradation brighter than the "predetermined gradation" in step S21 shown in FIG. 15 in the offset value acquisition processing as step S61 of the example shown in FIG. 20.

As the processing in step S7 of the example shown in FIG. 14, processing for "calculating a difference between a value of offset data and a value of light reception data to thereby calculate a luminance value of a pixel of attention (see FIG. 13)" is adopted. On the other hand, as processing in step S67 of the example shown in FIG. 20, processing for "calculating a difference between a value of light reception data and a value of offset data to thereby calculate a luminance value of a pixel of attention (see FIG. 19)" is adopted.

[Correction Data Acquisition Processing to Which the Third Example of the Burning Correction Control Method According to this Embodiment is Applied]

Figure 21:
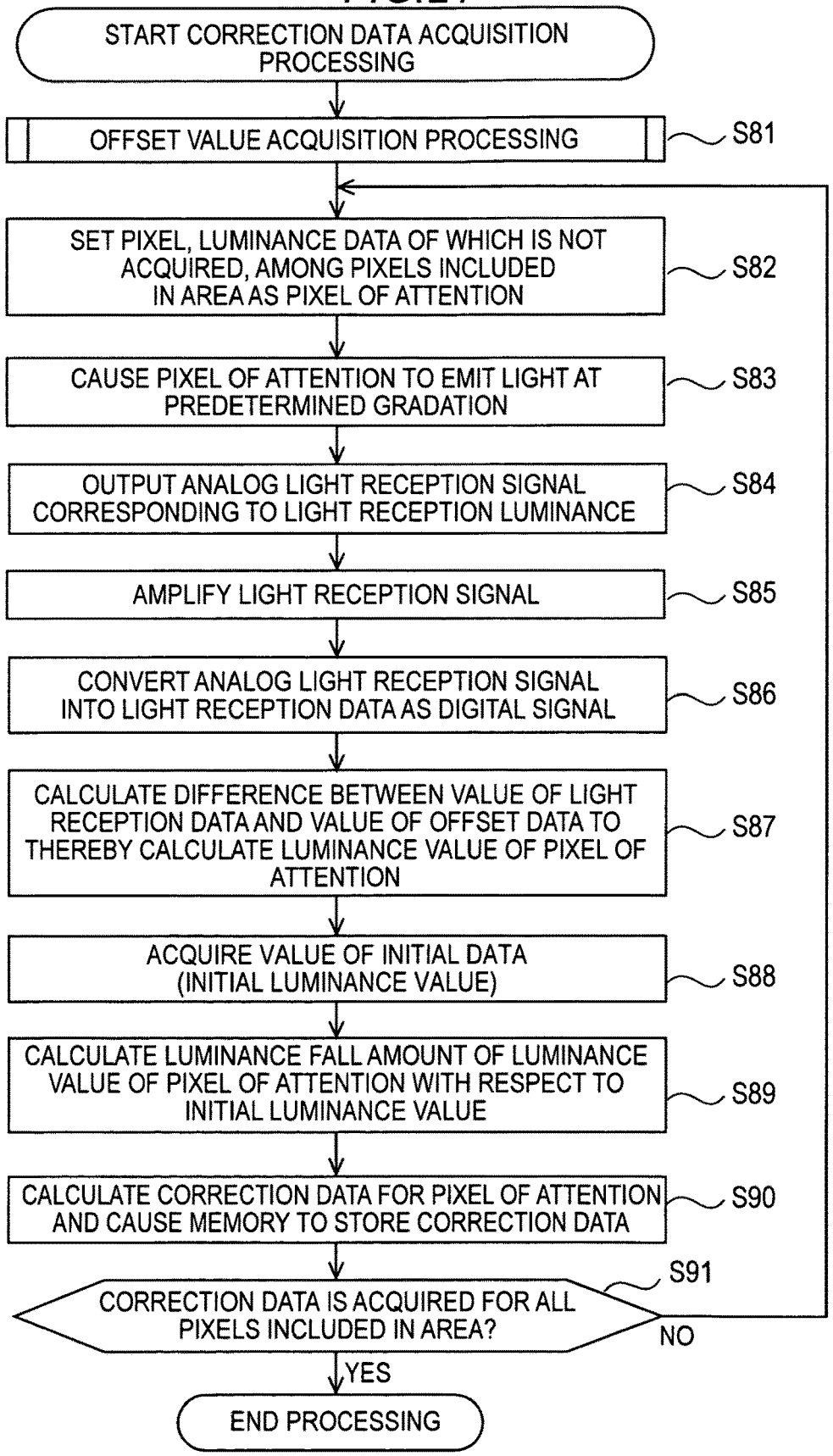
FIG. 21 is a flowchart for explaining an example of correction data acquisition processing executed when a predetermined period elapses after the initial data acquisition processing shown in FIG. 20 is performed.

FIG. 21 is a flowchart for explaining an example of correction data acquisition processing executed when a predetermined period elapses after the initial data acquisition processing shown in FIG. 20 is performed. Like the initial data acquisition processing shown in FIG. 20, the correction data acquisition processing is executed in parallel for each of the sectioned areas of the EL panel 2.

As it is easily seen when FIGS. 21 and 16 are compared, a series of flows of the correction data acquisition processing of the example shown in FIG. 21 is basically the same as a series of flows of the correction data acquisition processing of the example shown in FIG. 16. Therefore, processing different from the correction data acquisition processing of the example shown in FIG. 16 in the correction data acquisition processing of the example shown in FIG. 21 is explained.

Offset value acquisition processing is executed in the step S81 as in the processing of step S41 shown in FIG. 16. As processing in step S81, the offset value acquisition processing shown in FIG. 15 is executed. However, the "predetermined gradation" in step S21 shown in FIG. 15 is, as explained above, a gradation darker in the case of the offset value acquisition processing as step S81 of the example shown in FIG. 21 than the case of the offset value acquisition processing as step S41 of the example shown in FIG. 16.

In other words, the "predetermined gradation" in step S21 of the offset value acquisition processing is different in the initial data acquisition processing shown in FIG. 20 and the correction data acquisition processing shown in FIG. 21 because the pixels 101 are deteriorated in terms of gradations of luminances actually generated by the pixels 101. However, in terms of target gradations given to the pixels 101, the same gradation is adopted in the initial data acquisition processing shown in FIG. 20 and the correction data acquisition processing shown in FIG. 21 as the "predetermined gradation" in step S21 of the offset value acquisition processing.

Therefore, whereas the processing for "quenching a pixel of attention" is adopted as the processing in step S43 of the example shown in FIG. 16, processing for "causing a pixel of attention at a predetermined gradation" is adopted as processing in step S83 of the example shown in FIG. 21.

The "predetermined gradation" in step S83 is a gradation brighter than the "predetermined gradation" in the processing in step S21 shown in FIG. 15 in the offset value acquisition processing as step S61 of the example shown in FIG. 20.

In other words, the "predetermined gradation" in step S83 is a gradation different from the "predetermined gradation" in step S63 of the initial data acquisition processing shown in FIG. 20 because the pixels 101 set as the pixel of attention P is deteriorated. However, in terms of a target gradation given to the pixel of attention P, a gradation same as the "predetermined gradation" in step S63 of the initial data acquisition processing shown in FIG. 20 is adopted as the "predetermined gradation" in step S83.

As the processing in step S47 of the example shown in FIG. 16, the processing for "calculating a difference between a value of offset data and a value of light reception data to thereby calculate a luminance value of a pixel of attention (see FIG. 13)" is adopted. On the other hand, as processing in step S87 of the example shown in FIG. 21, processing for "calculating a difference between a value of light reception data and a value of offset data to thereby calculate a luminance value of a pixel of attention (see FIG. 19)" is adopted.

Fourth Example of the Burning Correction Control According to this Embodiment

A fourth example of the burning correction control according to this embodiment is explained.

In the third example explained with reference to FIG. 18, in the initial state (the state shown in B of FIG. 18), the light emission luminances of the pixels 101 included in the area (more accurately, since deterioration degrees of the pixels 101 are different, target luminance values) are uniformly set to the same gradation. However in the burning correction control according to this embodiment (excluding a fifth example explained later), a luminance value of a pixel of attention is calculated from a difference between a value of offset data and a value of light reception data. Therefore, the value of the offset data is not limited to the third example. Such a difference only has to be calculated from the value of the offset data. In the third example, the pixels 101 that emit lights at the same gradation in the initial state are all the pixels 101 included in the area. However, the number of pixels 101 that emit lights at the same gradation in the initial state is not limited to the third example and may be an arbitrary number as long as the determined pixels 101 emit lights. In the fourth example, in an initial state, only the pixels 101 in a predetermined part among the pixels 101 included in the area emit lights at the same gradation. Specifically, for example, the initial state of the fourth example is as shown in B of FIG. 22.

FIG. 22 is a diagram for explaining the fourth example of the burning correction control method according to this embodiment.

In A to H of FIG. 22, an area including 5×5 pixels 101 is shown. The light reception sensor 3 is arranged in the center of this area. In FIG. 22, a thin pattern (a thinnest pattern in FIG. 22) among hatched patterns in patterns in blocks indicating the pixels 101 indicates that the pixel of attention P emits light at a fixed first gradation. Thick patterns (patterns thicker than the thinnest pattern in FIG. 22) among the hatched patterns indicate that the pixel of attention P emits light at a fixed second gradation. The second gradation is a gradation darker than the first gradation. Right hatched patterns (thickest patterns in FIG. 22) indicate that the pixel of attention P is quenched. It should be note that the first gradation and the second gradation in FIG. 22 are not always the same as the first gradation and the second gradation in other figures.

In the fourth example, the signal processing unit 53 performs the burning correction control after causing a part of the pixels 101 included in the area to emit lights. Therefore, in the fourth example, as in the first to third example, the light reception intensity of the light reception sensor 3 can be increased and the light reception time of the light reception sensor 3 can be reduced, i.e., the response speed of the light reception sensor 3 can be increased.

In A of FIG. 22, setting order for the pixel of attention P in the fourth example is shown. The setting order itself of the pixel of attention P is the same as that in the third example shown in A of FIG. 18 and the like.

As an initial state, as shown in B of FIG. 22, the signal processing unit 53 causes each of the pixels 101 (in the example shown in B of FIG. 22, the pixels 101 arranged in lower three rows) as a part of the pixels 101 included in the area to emit light at a fixed gradation.

As it is seen when C to H of FIG. 22 and C to H of FIG. 18 are compared, subsequent processing in the fourth example is the same as the processing in the third example. Therefore, the processing conforming to the flowcharts shown in FIGS. 20, 21, and 15 can be directly applied to the fourth example as in the third example.

Fifth Example of the Burning Correction Control According to this Embodiment

A fifth example of the burning correction control according to this embodiment is explained. In the first to fourth examples of the burning correction control according to this embodiment explained above, a luminance value of a pixel of attention is calculated from a value of offset data and a value of light reception data. The value of the offset data is a value corresponding to a light reception signal of the light reception sensor 3 obtained when at least a part of the pixels 101 included in the area are caused to emit lights in the initial state. A purpose of setting such an initial state is to increase the response speed of the light reception sensor 3. In order to attain this purpose, the offset data is necessary. However, from the viewpoint of accuracy of burning correction for the pixel of attention P, if the offset data is present, the accuracy falls because of the offset data. This is further explained below with reference to FIGS. 23A and 23B.

Figure 23A:
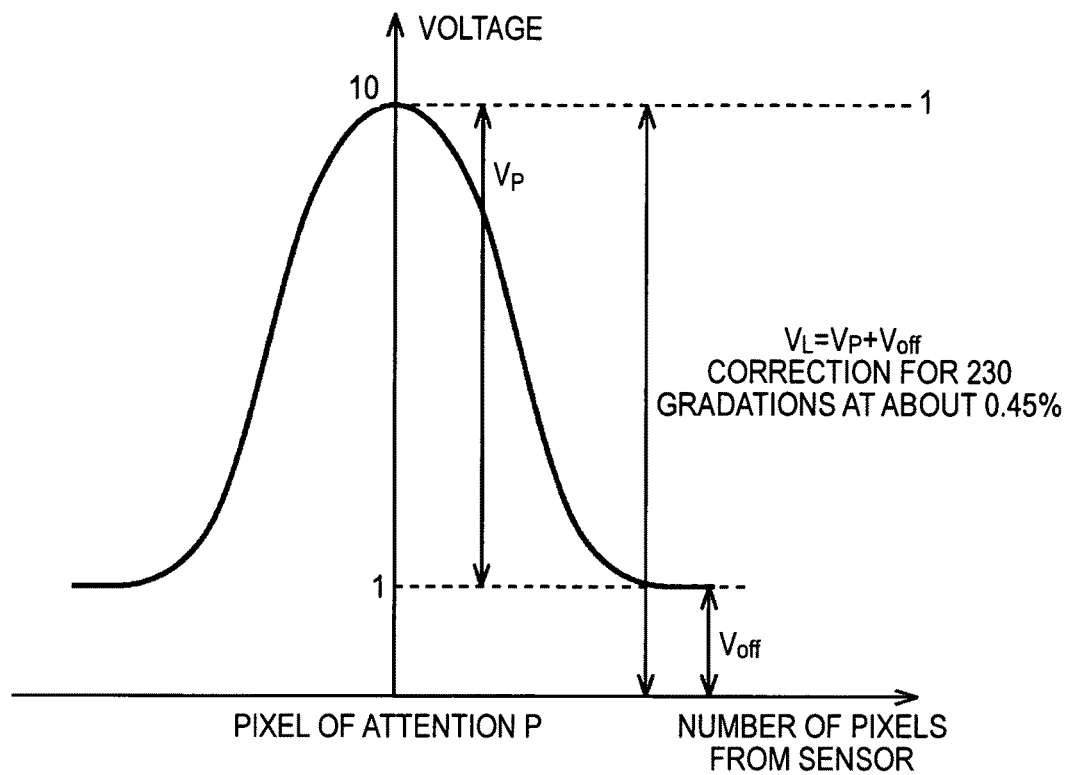
FIGS. 23A and 23B are graphs of a relation between maximum voltage of a light reception signal (an analog signal) of the light reception sensor 3 and the number of gradations obtained when the analog signal is digitized.
Figure 23B:
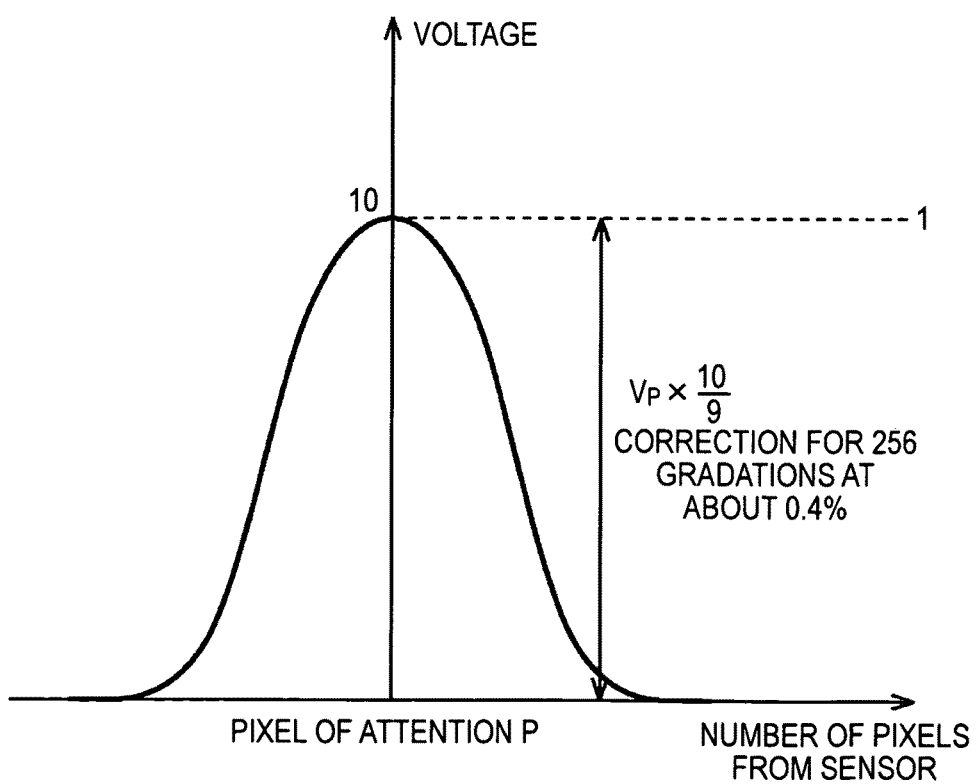

FIGS. 23A and 23B are graphs of a relation between maximum voltage of a light reception signal (an analog signal) of the light reception sensor 3 and the number of gradations obtained when the analog signal is digitized. Specifically, FIG. 23A is a graph in the case of the application of the third example of the burning correction control according to this embodiment. FIG. 23B is a graph in the case of the application of the fifth example of the burning correction control according to this embodiment. In FIGS. 23A and 23B, the ordinate indicates maximum voltage of an analog signal of a light reception signal of the light reception sensor 3 and the abscissa indicates a distance in a predetermined direction from the light reception sensor 3 (the unit is the number of pixels).

As shown in FIG. 23A, it is assumed that, when the pixel 101 distant from the light reception sensor 3 by 0 in terms of the number of pixels is set as the pixel of attention P, voltage VL of the light reception signal of the light reception sensor 3 is 10. Further, it is assumed that voltage Voff of the light reception signal of the light reception sensor 3 in the initial state is 1. In other words, a value of digital data corresponding to the voltage Voff is a value of offset data. Therefore, a differential voltage Vp=9 between the voltage VL and the voltage Voff of the light reception signal (an analog signal) of the light reception sensor 3 is analog voltage equivalent to a luminance value of the pixel of attention P. It is assumed that an analog signal having the voltage 10 is converted into 8-bit 256-gradation digital data. In this case, the analog signal having the differential voltage Vp converted into 8-bit 230-gradation digital data is equivalent to luminance data of the pixel of attention P. Therefore, accuracy of burning correction for the pixel of attention P in this case is 230-gradation accuracy (accuracy of about 0.45%), which is lower than 256-gradation accuracy (correction accuracy of 0.4%).

Therefore, in the fifth example, at a stage of the light reception signal (the analog signal) of the light reception sensor 3, a difference of the analog voltage equivalent to offset is calculated from the analog voltage. An analog signal having the differential voltage is appropriately amplified and the subjected to the A/D conversion. For example, in the example shown in FIGS. 23A and 23B, an analog signal having the differential voltage Vp=9 between the voltage VL and the voltage Voff of the light reception signal (the analog signal) of the light reception sensor 3 is generated. The analog signal is amplified by 10/9 and then subjected to the A/D conversion. Then, as shown in FIG. 23B, the analog signal is converted into 8-bit 256-gradation digital data. In the fifth example, such digital data is used as luminance data of the pixel of attention P. As a result, accuracy of burning correction for the pixel of attention P can be set to maximum accuracy as high as 256-gradation accuracy, i.e., correction accuracy of 0.4%.

[Functional Configuration Example of the Display Device 1 Necessary for Executing the Fifth Example of the Burning Correction Control]

Figure 24:
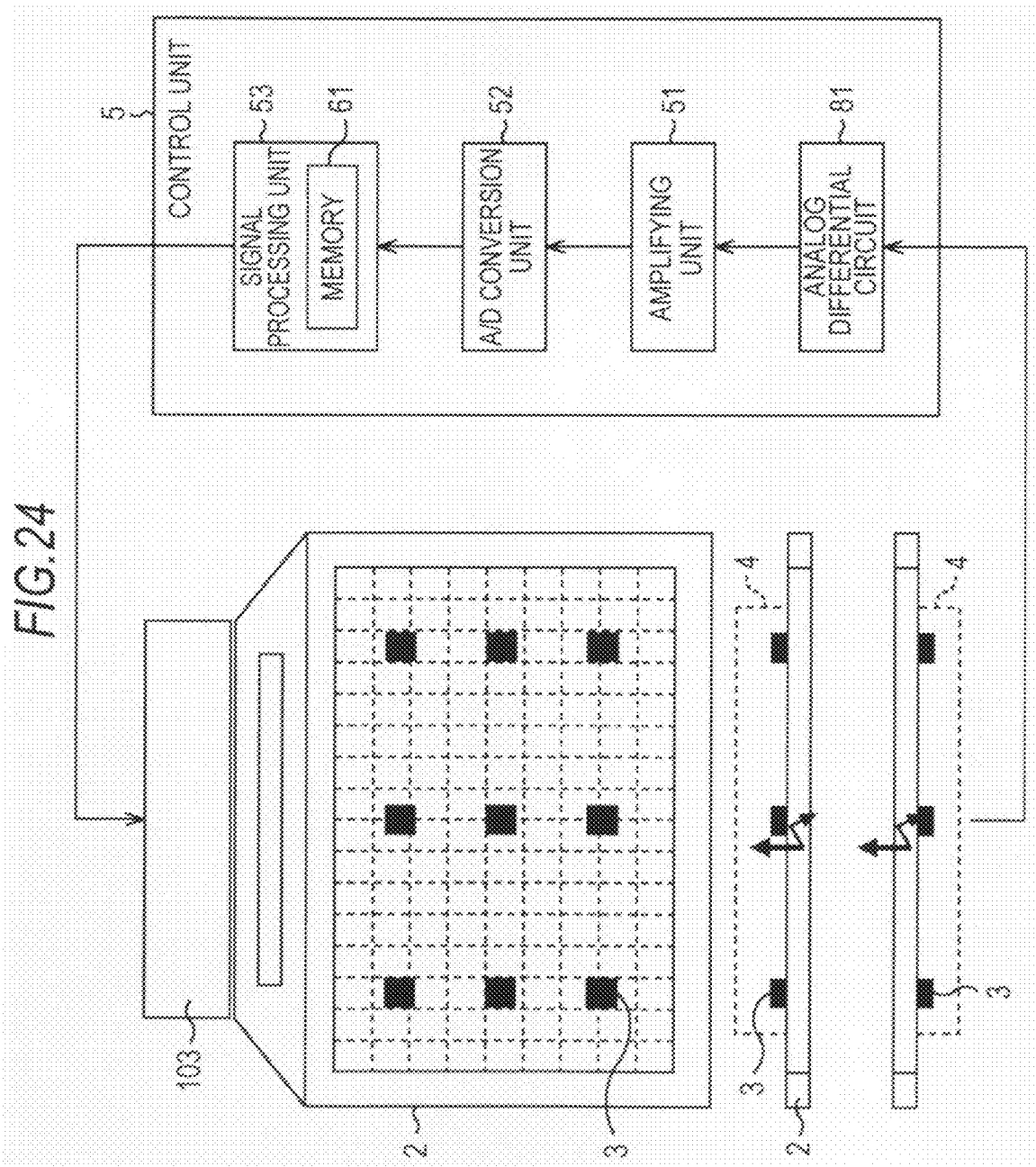
FIG. 24 is a functional block diagram of a functional configuration example of a display device 1 necessary for executing a fifth example of the burning correction control.

FIG. 24 is a functional block diagram of a functional configuration example of the display device 1 necessary for executing the fifth example of the burning correction control. In FIG. 24, components corresponding to those shown in FIG. 7 are denoted by the same reference numerals. Explanation of the components is omitted as appropriate.

In the example shown in FIG. 24, the control unit 5 further includes an analog differential circuit 81 in the configuration of the example shown in FIG. 7.

[Configuration Example and Operation Example of the Analog Differential Circuit 81]

Figure 25:
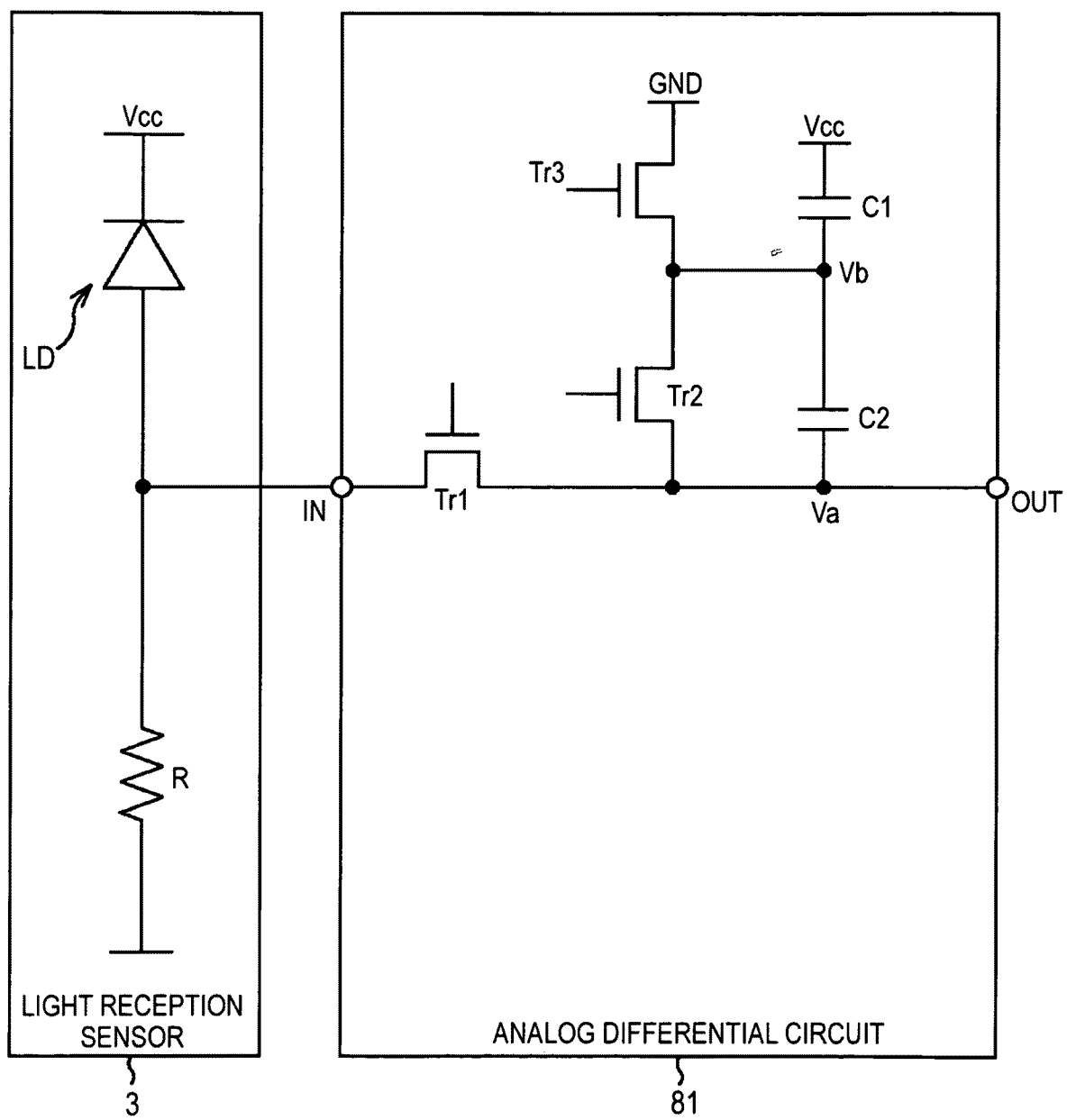
FIG. 25 is a diagram of a configuration example of an analog differential circuit 81.

FIG. 25 is a diagram of a configuration example of the analog differential circuit 81.

The analog differential circuit 81 includes three transistors Tr1 to Tr3 as switching elements (hereinafter referred to as switches Tr1 to Tr3) and two capacitors C1 and C2. Specifically, the switch Tr1 is connected between an input terminal IN and an output terminal OUT of the analog differential circuit 81. In a series connection circuit of the switches Tr2 and Tr3, the end on the switch Tr2 side is connected to the output terminal OUT and the end on the switch Tr3 side is grounded (GND). In a series connection circuit of the capacitor C1 and the capacitor C2, the end on the capacitor C2 side is connected to the output terminal OUT and the end on the capacitor C1 side is connected to a line of potential Vcc of a light reception element LD of the light reception sensor 3. The switch Tr2 and the capacitor C2 are connected at ends on the opposite side of ends connected to the output terminal OUT (ends to which the same voltage Va is applied). As a result, the same voltage Vb is applied to the ends on the opposite side. The input terminal IN is connected between the light reception element LD and a resistor R of the light reception sensor 3.

Figure 26:
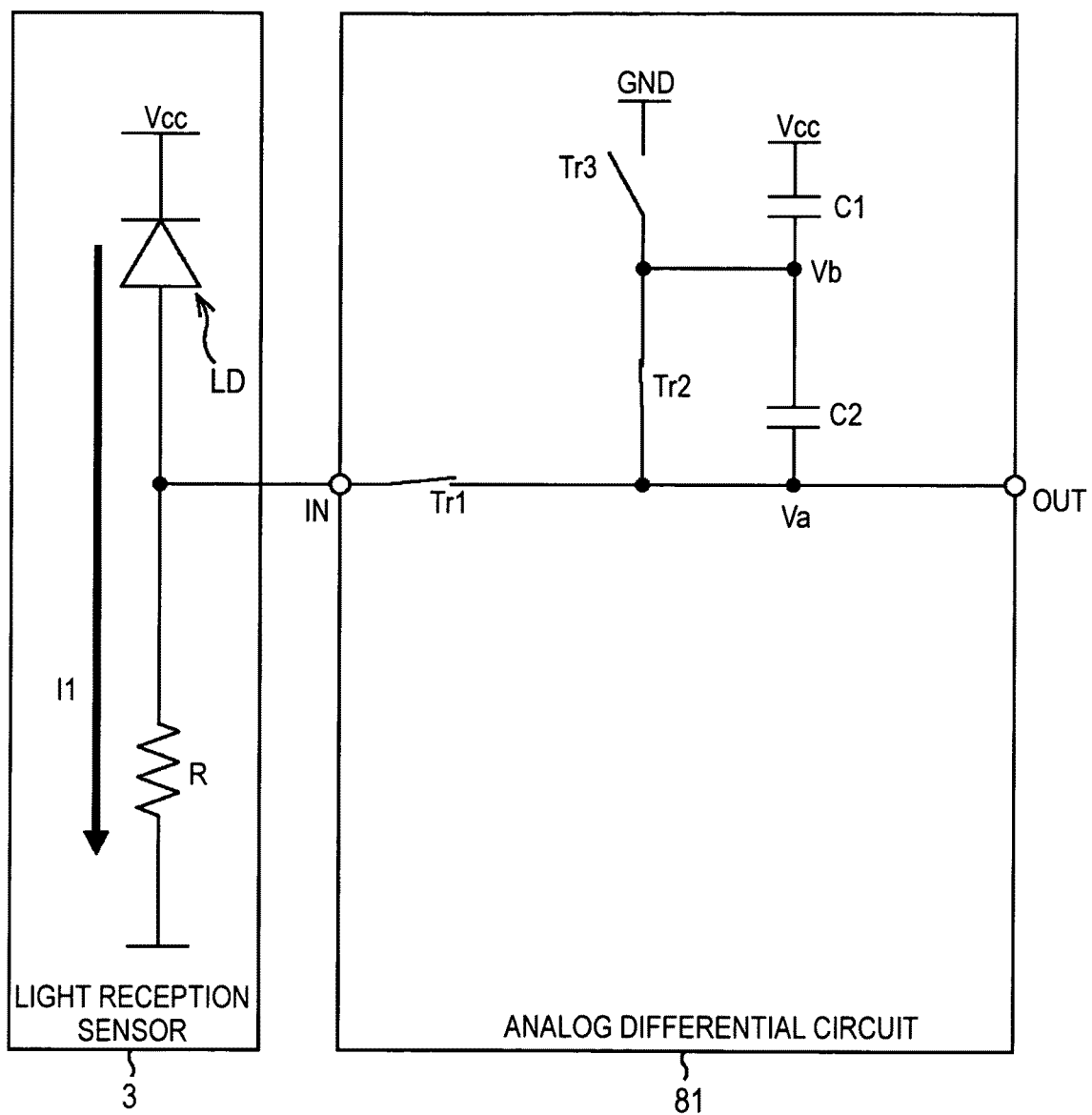
FIG. 26 is a diagram for explaining an operation example of the analog differential circuit 81.
Figure 27:
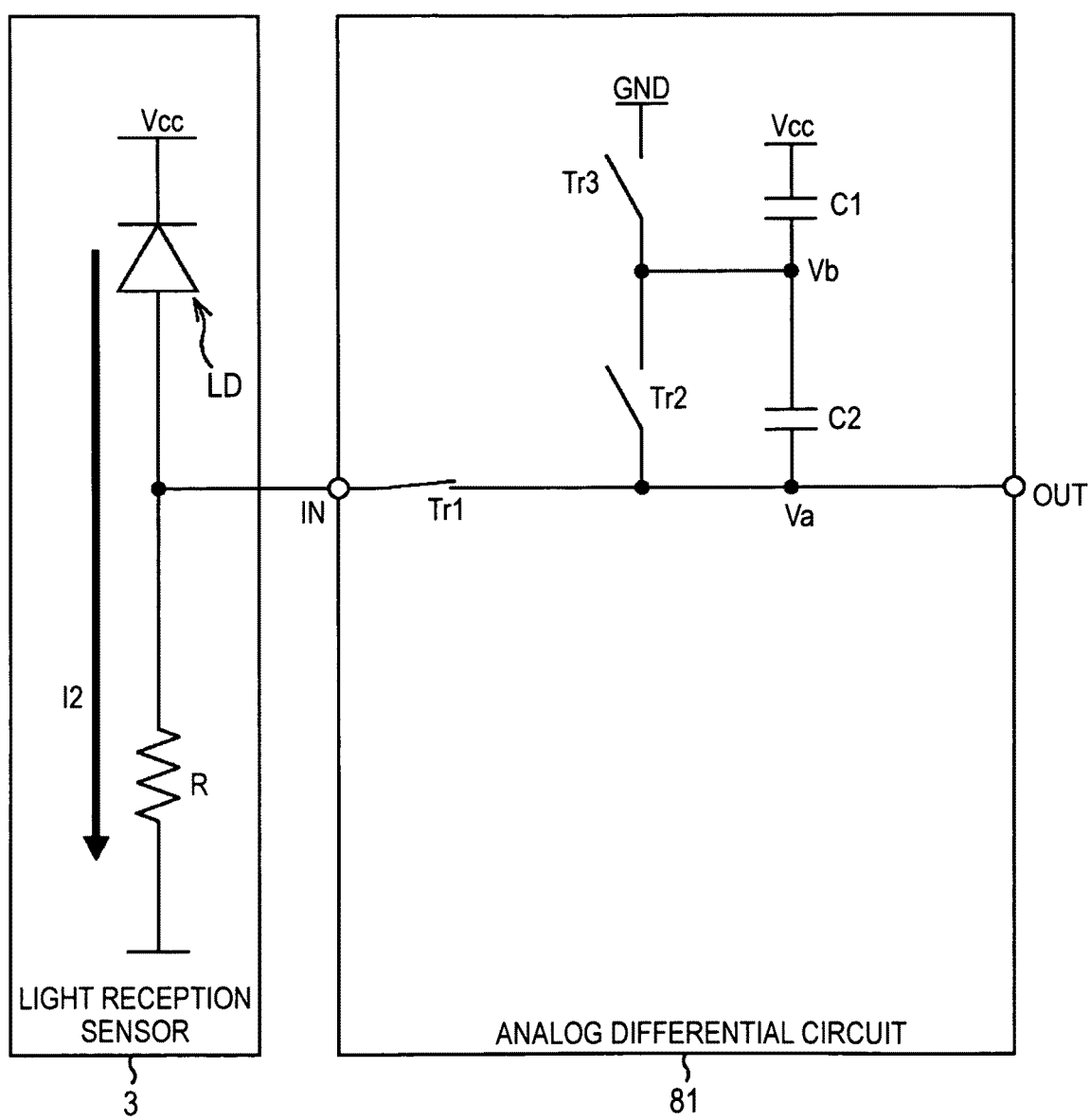
FIG. 27 is a diagram for explaining an operation example of the analog differential circuit 81.
Figure 28:
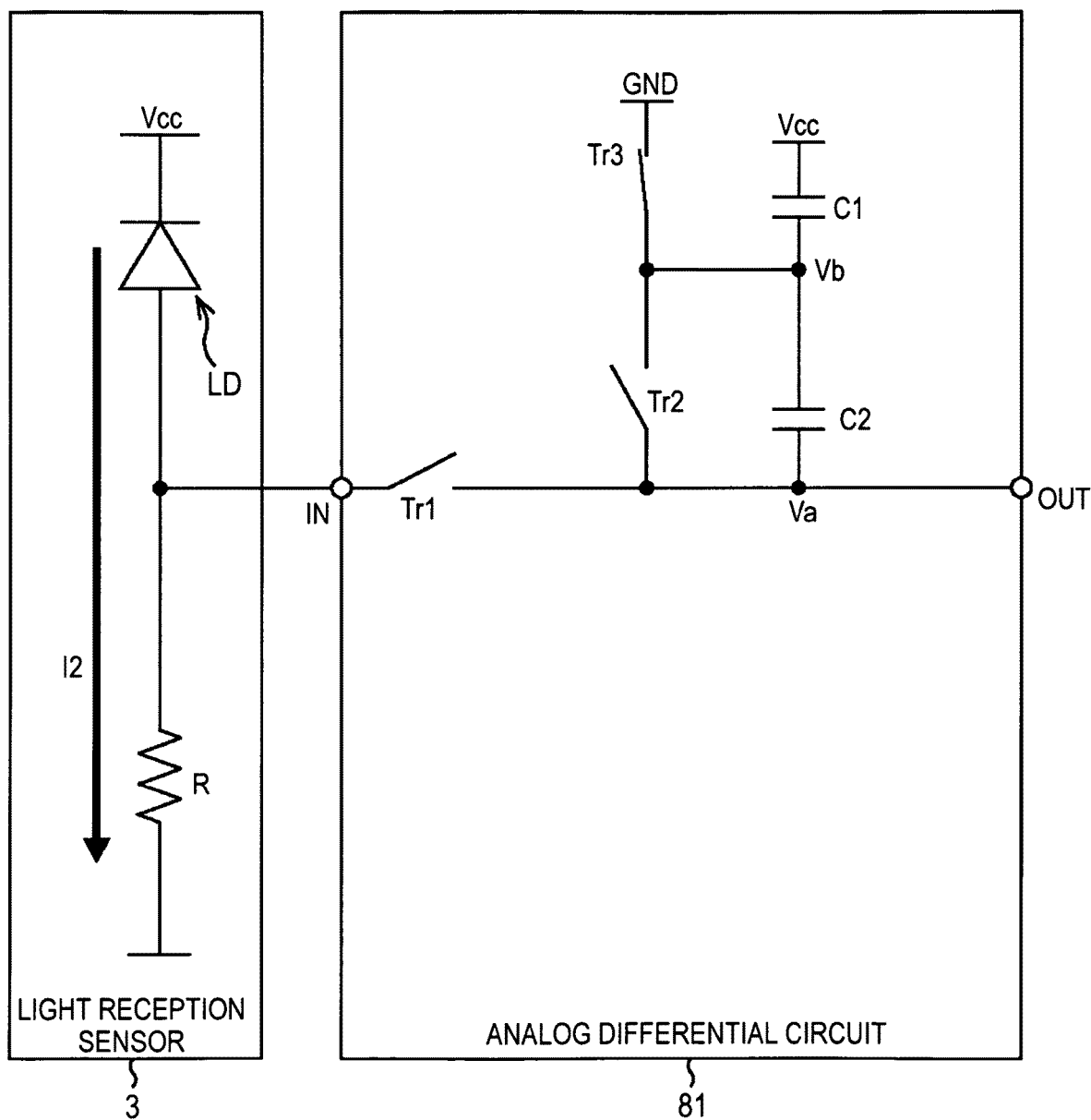
FIG. 28 is a diagram for explaining an operation example of the analog differential circuit 81.

FIGS. 26, 27, and 28 are diagrams for explaining an operation example of the analog differential circuit 81 having such a configuration.

A flow of processing of the entire burning correction control is basically the same as that in the third example shown in FIG. 18.

First, as an initial state, as shown in B of FIG. 18, the signal processing unit 53 causes the pixels 101 included in the area to uniformly emit lights at a predetermined gradation. At this point, as shown in FIG. 26, the analog differential circuit 81 turns on the switches Tr1 and Tr2 and turns off the switch Tr3. In this case, charges based on a light reception signal of the light reception sensor 3 are written in the capacitor C1 via the switches Tr1 and Tr2. Voltage Vb between the capacitor C1 and the capacitor C2 is a product of an electric current I1 flowing in the light reception sensor 3 and resistance R, i.e., $Vb=I1 \times R$. When $I1 \times R$ is described as V1, Vb is equal to V1 in the initial state. This voltage V1 is an analog voltage value corresponding to a value of offset data (hereinafter referred to as offset analog voltage value).

After the initial state, before light emission of the pixel of attention P (the pixel 101 in the first row×the first column) shown in C of FIG. 18 is started, as shown in FIG. 27, the analog differential signal 81 keeps the switch Tr1 on, transitions the switch Tr2 from on to off, and keeps the switch Tr3 off.

Thereafter, as shown in C of FIG. 18, the signal processing unit 53 causes only the pixel 101 as the pixel of attention P to emit light at a gradation brighter than a predetermined gradation in the initial state. In this case, charges based on a light reception signal of the light reception sensor 3 are written in the capacitor C2 via the switch Tr1. Voltage Va on the output terminal OUT side of the capacitor C2 is a product of an electric current I2 flowing in the light reception sensor 3 and the resistance R, i.e., $Va=I2 \times R$. When $I2 \times R$ is represented as V2, at this point, Va is equal to V2. This voltage V2 is an analog voltage value of the reception signal, i.e., an analog voltage corresponding to a value of the light reception data. When it is assumed that capacitances of the capacitors C1 and C2 are equal, $Vb=(V2-V1)/2$. In other words, the voltage Vb is a voltage value of an analog difference between the analog voltage value of the light reception signal and the offset analog voltage value (accurately, a voltage value half as large as the voltage value).

Therefore, as shown in FIG. 28, the analog differential circuit 81 transitions the switch Tr1 from on to off and transitions the switch Tr3 from off to on. Then, the voltage Vb is dropped to the GND level. Consequently, Va is equal to $(V2-V1)/2$. Therefore, a signal having this voltage $(V2-V1)/2$, i.e., voltage $Va=(V2-V1)/2$ of the analog difference between the analog voltage value of the light reception signal and the offset analog voltage value (hereinafter referred to as analog differential signal) is output from the output terminal OUT of the analog differential circuit 81.

[Initial Data Acquisition Processing to Which the Fifth Example of the Burning Correction Control Method According to this Embodiment is Applied]

Figure 29:
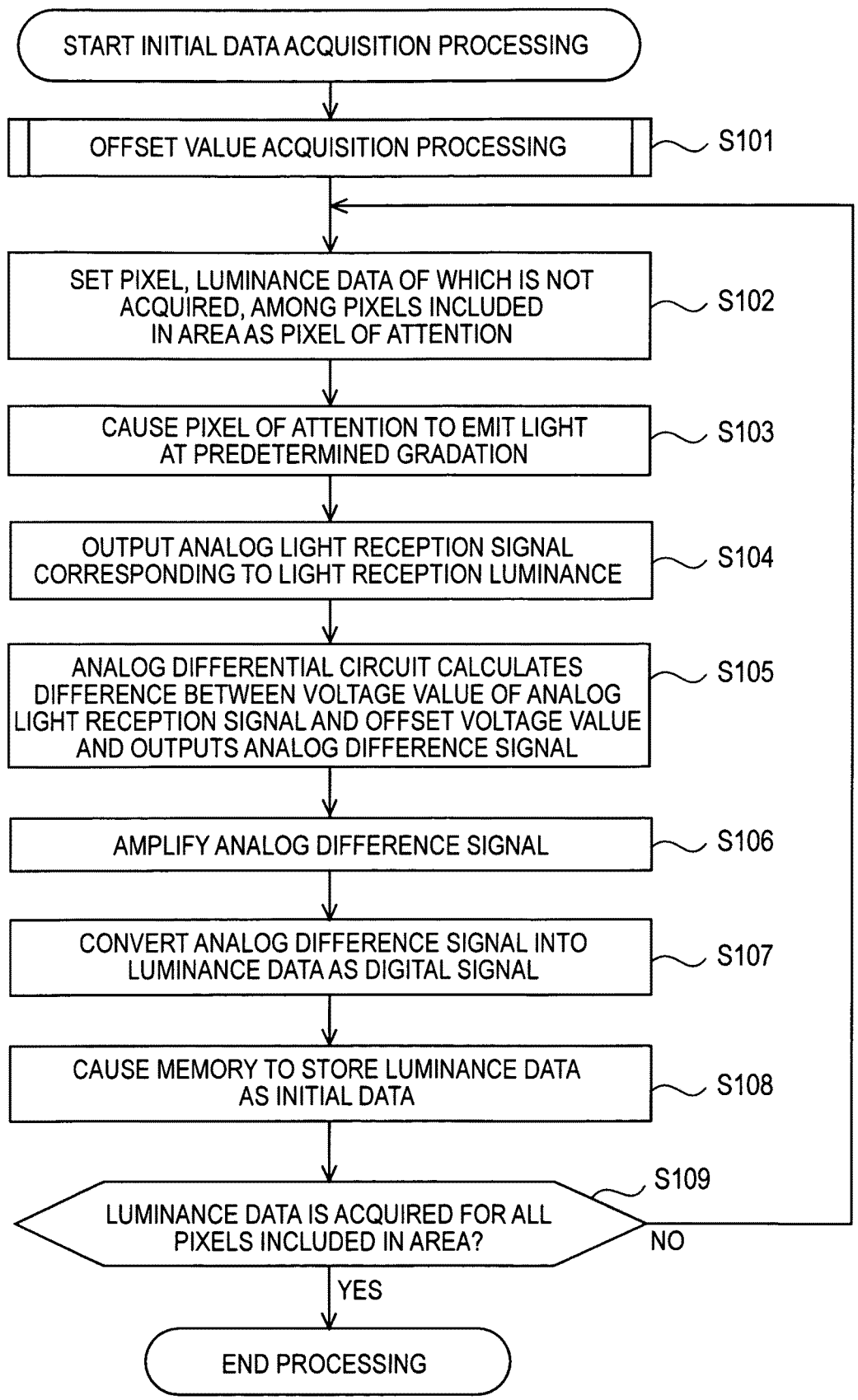
FIG. 29 is a flowchart for explaining an example of initial data acquisition processing for realizing the fifth example of the burning correction control method according to the embodiment.

FIG. 29 is a flowchart for explaining an example of initial data acquisition processing for realizing the fifth example of the burning correction control method according to this embodiment in the processing executed by the display device 1.

The initial data acquisition processing of the example shown in FIG. 29 is executed, for example, in parallel for each of the sections areas of the EL panel 2. In other words, the initial data acquisition processing shown in FIG. 29 is executed in parallel for each of the light reception sensors 3.

As it is easily seen when FIGS. 29 and 20 are compared, a series of flows of the initial data acquisition processing of the example shown in FIG. 29 is similar to the series of flows of the initial data acquisition processing of the example shown in FIG. 20. Therefore, only processing different from the initial data acquisition processing of the example shown in FIG. 20 in the initial data acquisition processing of the example shown in FIG. 29 is explained.

In the first step S101, instead of the offset value acquisition processing in step S61 shown in FIG. 20, a series of processing for the analog differential circuit 81 to keep an offset value is executed. Such processing is hereinafter referred to as offset value keeping processing.

Figure 30:
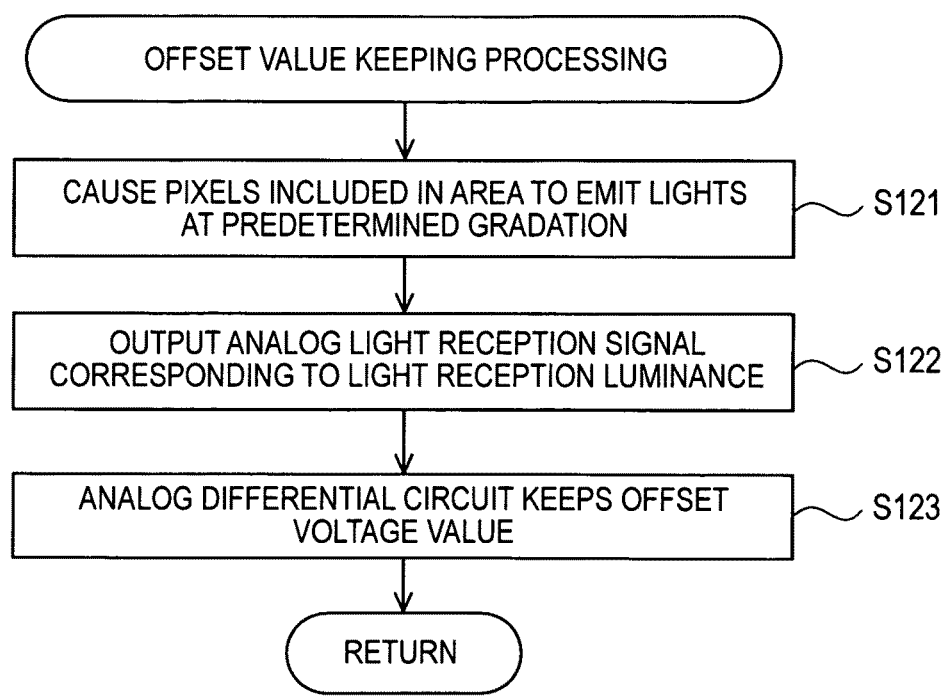
FIG. 30 is a flowchart for explaining a detailed example of offset value storing processing.

FIG. 30 is a flowchart for explaining a detailed example of the offset value keeping processing in step S101.

As it is easily seen when FIGS. 30 and 15 are compared, processing in steps S121 and S122 of the example shown in FIG. 30 is the same as the processing in steps S21 and S22 of the offset value acquisition processing shown in FIG. 15. Therefore, explanation of the processing is omitted.

In step S123, the analog differential circuit 81 keeps the offset voltage value. As processing in step S123, the processing explained with reference to FIGS. 26 and 27 is executed. When the offset value keeping processing ends, i.e., when the processing in step S101 shown in FIG. 29 ends, the processing proceeds to step S102.

Processing from steps S102 to S104 is the same as the processing in steps S62 to S64 shown in FIG. 20. Therefore, explanation of the processing is omitted.

In step S105, the analog differential circuit 81 calculates a difference between the voltage value of the analog light reception signal and the offset voltage value and outputs an analog difference signal.

In step S106, the amplifying unit 51 amplifies the analog difference signal at a predetermined amplification ratio and supplies the difference signal to the A/D conversion unit 52.

In step S107, the A/D conversion unit 52 converts the amplified analog difference signal into luminance data as a digital signal (see FIG. 23B) and supplies the luminance data to the signal processing unit 53.

In the example shown in FIG. 29, difference processing at a stage of an analog signal is performed in the processing in step S105. Therefore, difference processing at a stage of digital data like the processing in step S67 of the example shown in FIG. 20 is unnecessary.

In step S108, the signal processing unit 53 causes the memory 61 to store the luminance data as initial data.

In step S109, the signal processing unit 53 determines whether luminance data is acquired for all the pixels 101 included in the area. When it is determined in step S109 that luminance data is not acquired for all the pixels 101 included in the area, the processing is returned to step S101 and loop processing of the processing in steps S101 to S109 is repeated. Specifically, each of the pixels 101 included in the area is sequentially set as the pixel of attention P and such loop processing is repeatedly executed, whereby initial data of all the pixels 101 included in the area is acquired and stored in the memory 61.

Consequently, it is determined in step S109 that luminance data is acquired for all the pixels 101 included in the area. The initial data acquisition processing ends.

[Correction Data Acquisition Processing to Which the Fifth Example of the Burning Correction Control Method According to this Embodiment is Applied]

Figure 31:
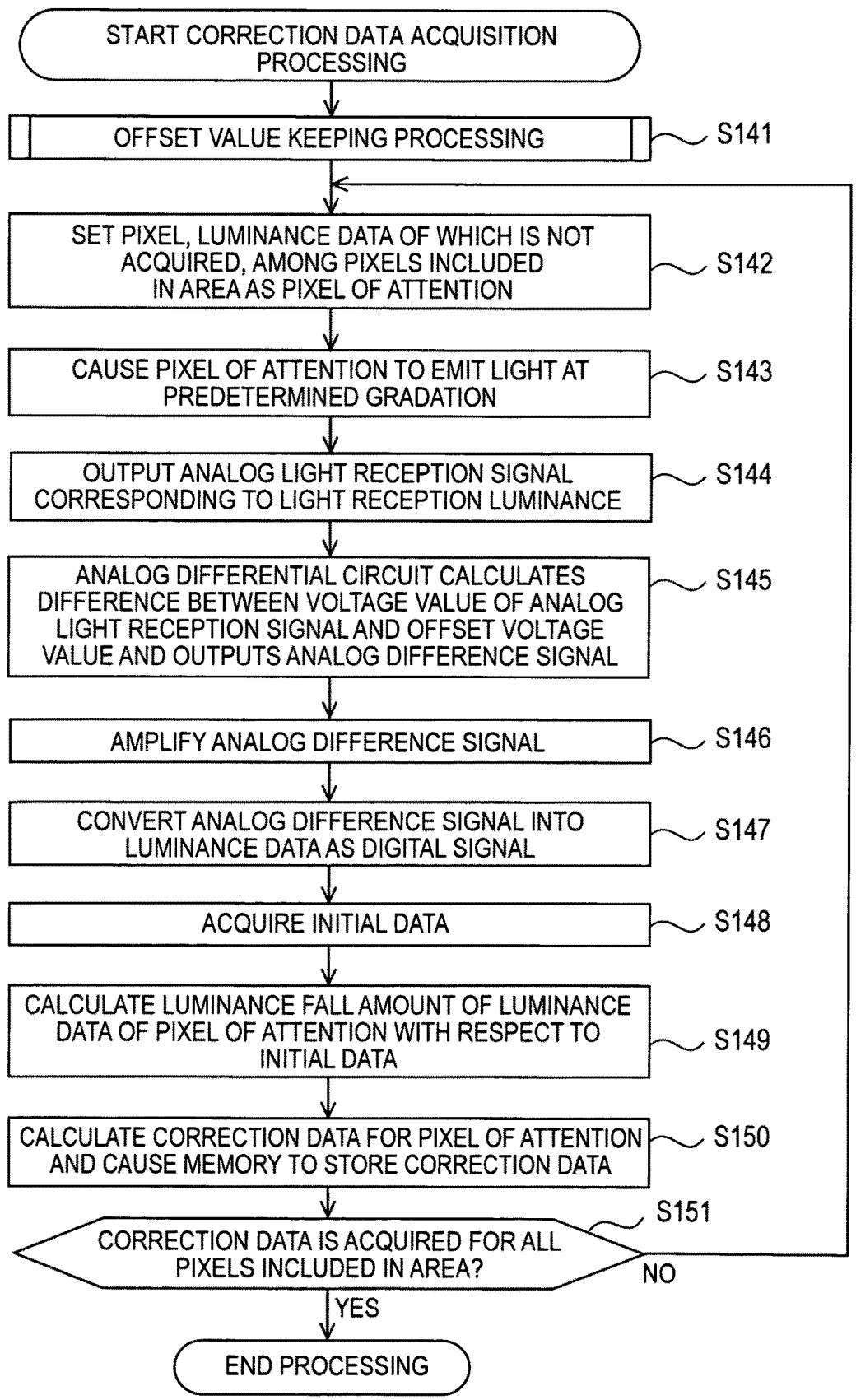
FIG. 31 is a flowchart for explaining an example of correction data acquisition processing executed when a predetermined period elapses after the initial data acquisition processing shown in FIG. 29 is performed.

FIG. 31 is a flowchart for explaining an example of correction data acquisition processing executed when a predetermined period elapses after the initial data processing shown in FIG. 29 is performed. Like the initial data processing shown in FIG. 29, the correction data acquisition processing is also executed in parallel for each of the sectioned areas of the EL panel 2.

Processing in steps S141 to S147 is the same as the processing in steps S101 to S107 shown in FIG. 29 explained above. Therefore, explanation of the processing is omitted. Processing in steps S148 to S150 is the same as the processing in steps S48 to S50 shown in FIG. 16. Therefore, explanation of the processing is omitted.

In step S151, the signal processing unit 53 determines whether correction data is acquired for all the pixels 101 included in the area. When it is determined in step S151 that correction data is not acquired for all the pixels 101 included in the area, the processing is returned to step S141 and loop processing of the processing in steps S141 to S151 is repeated. Specifically, each of the pixels 101 included in the area is sequentially set as the pixel of attention P and such loop processing is repeatedly executed, whereby correction data of all the pixels 101 included in the area is acquired and stored in the memory 61.

Consequently, it is determined in step S151 that luminance data is acquired for all the pixels 101 included in the area. The correction data acquisition processing ends.

[Application of this Embodiment]

Embodiments of the present invention are not limited to the embodiment explained above. Various modifications are possible without departing from the spirit of the present invention.

For example, the pattern structure of the pixel 101 explained above can be adopted for, besides the self-emission panel including the organic EL (Electro Luminescent) device, other self-emitting panels such as an FED (Field Emission Display).

As explained with reference to FIG. 4, the pixel 101 includes the two transistors (the sampling transistor 31 and the driving transistor 32) and the one capacitor (the storage capacitor 33). However, other circuit configurations can be adopted.

As the other circuit configurations of the pixel 101, for example, besides the configuration including two transistors and one capacitor (hereinafter also referred to as 2Tr/1C pixel circuit), a circuit configuration explained below can be adopted. The circuit configuration is a configuration including five transistors and one capacitor (hereinafter also referred to as 5Tr/1C pixel circuit) in which first to third transistors are added. In the pixel 101 in which the 5Tr/1C pixel circuit is adopted, signal potential supplied from the horizontal selector 103 to the sampling transistor 31 via the video signal line DTL10 is fixed to Vsig. As a result, the sampling transistor 31 operates as a function of switching the supply of the signal potential Vsig to the driving transistor 32. Potential supplied to the driving transistor 32 via the power supply line DSL10 is fixed to the first potential Vcc. The added first transistor switches the supply of the first potential Vcc to the driving transistor 32. The second transistor switches the supply of the second potential Vss to the driving transistor 32. The third transistor switches the supply of the reference potential Vof to the driving transistor 32.

As the other circuit configurations of the pixel 101, intermediate circuit configurations of the 2Tr/1C pixel circuit and the 5Tr/1C pixel circuit can also be adopted. The circuit configurations are a configuration including four transistors and one capacitor (4Tr/1C pixel circuit) and a configuration including three transistors and one capacitor (3Tr/1C pixel circuit). As the 4Tr/1C pixel circuit and the 3Tr/1C pixel circuit, for example, a configuration for pulsing, with Vsig and Vofs, signal potential supplied from the horizontal selector 103 to the sampling transistor 31 can be adopted. In other words, a configuration in which the third transistor or both the second and third transistors are omitted can be adopted.

For the purpose of, for example, supplementing a capacitance component of an organic light emitting component, an auxiliary capacitor may be added between an anode and a cathode of the light emitting element 34 in the 2Tr/1C pixel circuit, the 3Tr/1C pixel circuit, the 4Tr/1C pixel circuit, or the 5Tr/1C pixel circuit.

In this specification, the steps described in the flowcharts include not only processing performed in time series according to the described order but also processing executed in parallel or individually, although not always performed in time series.

The present invention can be applied not only to the display device 1 shown in FIG. 1 but also to various display devices. The display devices to which the prevent invention is applied can be applied to a display that displays, as images or videos, video signals input to various electronic apparatuses or generated in various electronic apparatuses. Examples of the various electronic apparatuses include a digital still camera and a digital video camera, a notebook personal computer, a cellular phone, and a television receiver. Examples of such electronic apparatuses to which the display device is applied are explained below.

For example, the present invention can be applied to a television receiver as an example of the electronic apparatuses. The television receiver includes a video display screen including a front panel and a filter glass. The television receiver is manufactured by using the display device according to the embodiment for the video display screen.

For example, the present invention can be applied to a notebook personal computer as an example of the electronic apparatuses. In the notebook personal computer, a main body includes a keyboard operated in inputting characters and the like. A body cover for the main body includes a display unit that displays an image. The notebook personal computer is manufactured by using the display device according to the embodiment for the display unit.

For example, the present invention can be applied to a portable terminal apparatus as an example of the electronic apparatuses. The portable terminal apparatus includes an upper housing and a lower housing. As states of the portable terminal apparatus, there are a state in which the two housings are open and a state in which the two housings are closed. The portable terminal apparatus includes, besides the upper housing and the lower housing, a coupling unit (a hinge unit), a display, a sub-display, a picture light, and a camera. The portable terminal apparatus is manufactured by using the display device according to the embodiment for the display and the sub-display.

For example, the present invention can be applied to a digital video camera as an example of the electronic apparatuses. The digital video camera includes a main body unit, a subject photographing lens on a side facing the front, a start/stop switch for photographing, and a monitor. The digital video camera is manufactured by using the display device according to the embodiment for the monitor.

The present application contains subject matter related to that disclosed in Japanese Priority Patent Application JP 2008-293286 filed in the Japan Patent Office on Nov. 17, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a display panel including a plurality of pixels configured to emit light based on a magnitude of a video signal, the plurality of pixels are sectioned into a plurality of areas of the display panel;
   a plurality of light reception sensors, at least one light reception sensor of the plurality of light reception sensors is arranged in one area of the plurality of areas, each light reception sensor of the plurality of light reception sensors is configured to receive incident light and output a light reception signal based on a total luminance value of the incident light that is received; and
   signal processing means configured to process one or more light reception signals from the plurality of light reception sensors,
   wherein a first area of the plurality of areas of the display panel includes
      a first light reception sensor of the plurality of light reception sensors,
      a first pixel group of the plurality of pixels including at least one pixel, and
      a second pixel group of the plurality of pixels including pixels other than the first pixel group, and
   wherein the signal processing means is configured to
      obtain the light reception signal from the first light reception sensor,
      when the first pixel group and the second pixel group are caused to emit the light at a light emission luminance corresponding to a signal voltage of the video signal, set the light reception signal that is obtained from the first light reception sensor when the first pixel group and the as an offset value, and
      when the second pixel group is caused to emit the light at the light emission luminance corresponding to the signal voltage of the video signal and the first pixel group is caused to emit the light at a second light emission luminance different from the light emission luminance corresponding to the signal voltage of the video signal, set the light reception signal that is obtained from the first light reception sensor as a light reception value, and
   wherein the signal processing means further includes
      an arithmetic means configured to
         perform an arithmetic function of the offset value and the light reception value, and
         output an arithmetic signal based on the arithmetic function of the offset value and the light reception value,
      a converting means configured to output digital data based on the arithmetic signal, and
      a modifying means configured to
         determine correction data based on the digital data,
         modify the video signal using the correction data, and
         supply the video signal that is modified to the first pixel group.

2. The display device according to claim 1, wherein the light emission luminance corresponding to the signal voltage of the video signal is at a predetermined gradation.

3. The display device according to claim 1, wherein, in the first area of the display panel, the second pixel group includes all pixels of the plurality of pixels other than the first pixel group.

4. The display device according to claim 1, wherein, in the first area of the display panel, the second pixel group includes some of the plurality of pixels other than the first pixel group.

5. The display device according to claim 1, wherein, when the light emission luminance corresponding to the signal voltage of the video signal is maintained by the second pixel group and the second light emission luminance of the first pixel group is decreased from the light emission luminance corresponding to the signal voltage of the video signal, the signal processing means is further configured to set the light reception signal that is obtained from the first light reception sensor as the light reception value.

6. The display device according to claim 1, wherein each pixel of the plurality of pixels is configured to emit the light with one or more self-emitting elements.

7. The display device according to claim 1, wherein the converting means is an analog-to-digital (A/D) converter.

8. The display device according to claim 1, wherein the arithmetic function is a calculation of a difference between the offset value and the light reception value.

* * * * *